United States Patent
Okumura

(10) Patent No.: US 8,010,878 B2
(45) Date of Patent: Aug. 30, 2011

(54) DATA TRANSMISSION METHOD, DATA TRANSMISSION SYSTEM, TRANSMITTING METHOD, RECEIVING METHOD, TRANSMITTING APPARATUS AND RECEIVING APPARATUS

(75) Inventor: Yukihiko Okumura, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 333 days.

(21) Appl. No.: 11/910,248

(22) PCT Filed: Mar. 30, 2006

(86) PCT No.: PCT/JP2006/306729
§ 371 (c)(1),
(2), (4) Date: Sep. 15, 2009

(87) PCT Pub. No.: WO2006/106864
PCT Pub. Date: Oct. 12, 2006

(65) Prior Publication Data
US 2010/0275103 A1    Oct. 28, 2010

(30) Foreign Application Priority Data
Mar. 30, 2005 (JP) .................... 2005-100187

(51) Int. Cl.
*H03M 13/00* (2006.01)
(52) U.S. Cl. ...................... 714/776; 375/253
(58) Field of Classification Search .......... 714/752, 714/758, 776; 375/253, 341
See application file for complete search history.

(56) References Cited

U.S. PATENT DOCUMENTS

| 5,896,374 A | 4/1999 | Okumura et al. |
| 6,108,384 A | 8/2000 | Okumura et al. |
| 7,020,209 B1 | 3/2006 | Okumura |

FOREIGN PATENT DOCUMENTS

| JP | 11-112359 | 4/1999 |
| JP | 2002-158642 | 5/2002 |
| WO | 96/26582 | 8/1996 |
| WO | 97/50219 | 12/1997 |
| WO | 00/79720 A1 | 12/2000 |

*Primary Examiner* — Sam Rizk
(74) *Attorney, Agent, or Firm* — Workman Nydegger

(57) ABSTRACT

In variable rate data transmission, a data transmission method or the like is provided which enables adjustment for achieving desired erroneous rate detection. A transmitting side places a calculated error detecting code after the transmission data in each frame, generates frame data in which an R-bit series before the final bit position of the error detecting code is rearranged in inverse order, and transmits. A receiving side assumes the transmission data and error detecting code by assuming the final bit position of the frame data in each frame, conducting the assumption presuming that the rearrangement in inverse order has occurred on the transmitting side. Among the assumed final bit positions, the position determined to be errorless as a result of the error detection based on the assumed transmission data and error detecting code is determined as the final bit position. R can be greater or less than the number of bits of the error detecting code.

8 Claims, 27 Drawing Sheets

○ TRANSMISSION BIT SEQUENCE (D0-D9 DESIGNATE TRANSMISSION DATA; AND C4-C0 DESIGNATE CRC BITS)

POSTPOSITION 1: D9,D8,D7,D6,D5,D4,D3,D2,D1,D0,C4,C3,C2,C1,C0

PREPOSITION: C4,C3,C2,C1,C0,D9,D8,D7,D6,D5,D4,D3,D2,D1,D0

FIG.1A

○ RECEIVED DATA BITS AND RECEIVED CRC BITS (WHEN DETECTING POSITION ONE BIT LESS THAN CORRECT RATE POSITION)

POSTPOSITION 1: DATA = D9,D8,D7,D6,D5,D4,D3,D2,D1  CRC=D0,C4,C3,C2,C1

PREPOSITION: DATA = D9,D8,D7,D6,D5,D4,D3,D2,D1  CRC=C4,C3,C2,C1,C0

FIG.1B

[TRANSMITTING SIDE]

TRANSMITTED SIGNAL: | 1 0 0 0 1 0 0 1 0 0 | 1 0 1 1 0 |

TRANSMISSION DATA | CRC CODE

↑ FINAL BIT POSITION

[RECEIVING SIDE]

■ WHEN CORRECT FINAL BIT POSITION IS ASSUMED

RECEIVED SIGNAL: | 1 0 0 0 1 0 0 1 0 0 | 1 0 1 1 0 |

TRANSMISSION DATA | CRC CODE

↑ ASSUMED AS FINAL BIT POSITION

■ WHEN POSITION ONE BIT SHORTER THAN THE CORRECT FINAL BIT POSITION IS ASSUMED TO BE FINAL BIT POSITION

RECEIVED SIGNAL: | 1 0 0 0 1 0 0 1 0 | 0 1 0 1 1 | 0

TRANSMISSION DATA | CRC CODE

↑ ASSUMED AS FINAL BIT POSITION

FIG.2

○ TRANSMISSION BIT SEQUENCE (D0-D9 DESIGNATE TRANSMISSION DATA; AND C4-C0 DESIGNATE CRC BITS)

POSTPOSITION 1: D9,D8,D7,D6,D5,D4,D3,D2,D1,D0,C4,C3,C2,C1,C0

POSTPOSITION 2: D9,D8,D7,D6,D5,D4,D3,D2,D1,D0,C0,C1,C2,C3,C4

FIG.3A

○ RECEIVED DATA BITS AND RECEIVED CRC BITS (WHEN DETECTING POSITION ONE BIT LESS THAN CORRECT RATE POSITION)

POSTPOSITION 1: DATA = D9,D8,D7,D6,D5,D4,D3,D2,D1  CRC=D0,C4,C3,C2,C1

POSTPOSITION 2: DATA = D9,D8,D7,D6,D5,D4,D3,D2,D1  CRC=D0,C0,C1,C2,C3

⇩ REARRANGE IN INVERSE ORDER

CRC=C3,C2,C1,C0,D0

FIG.3B

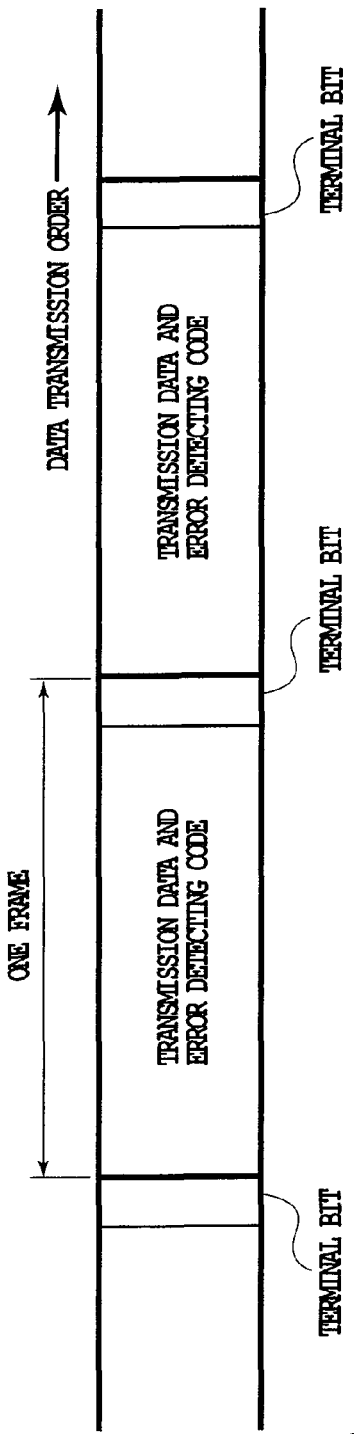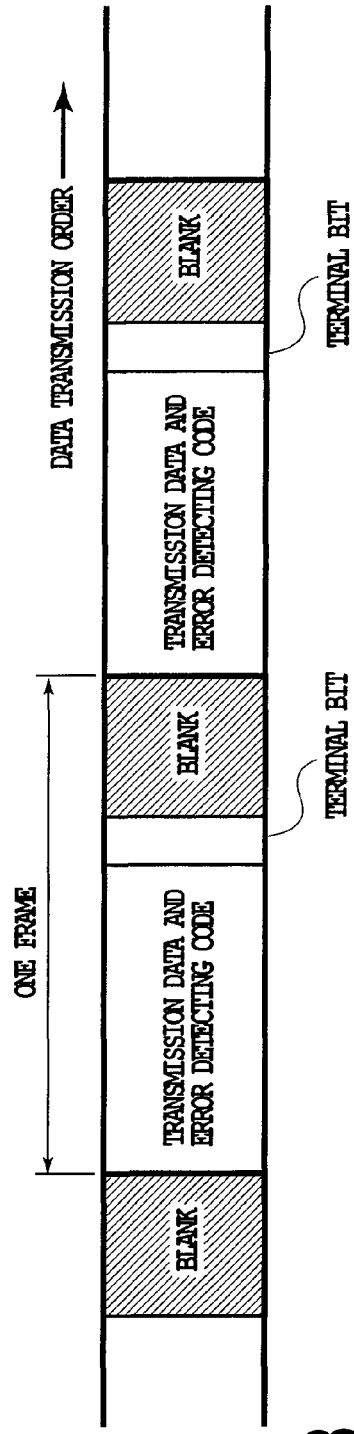

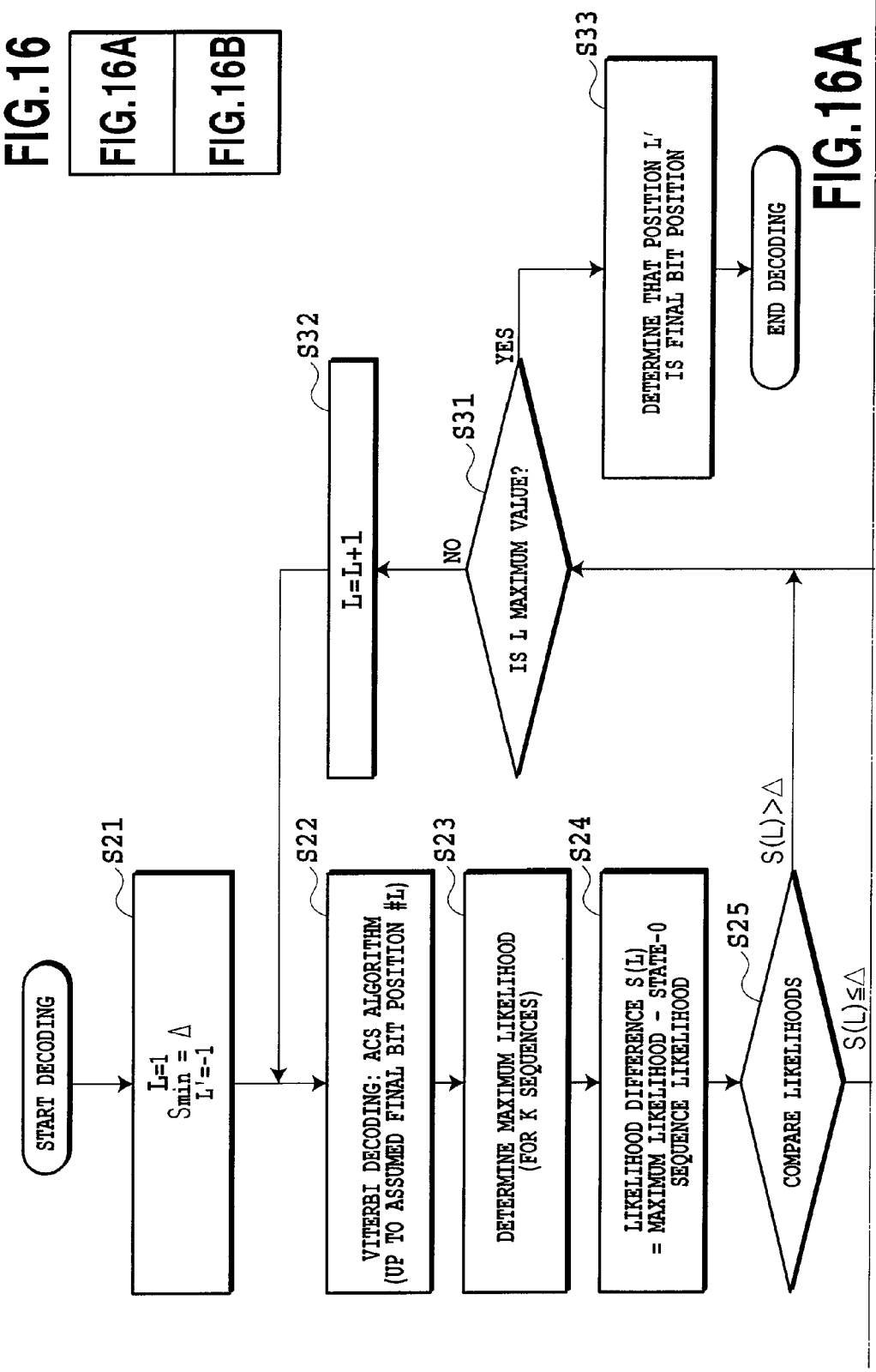

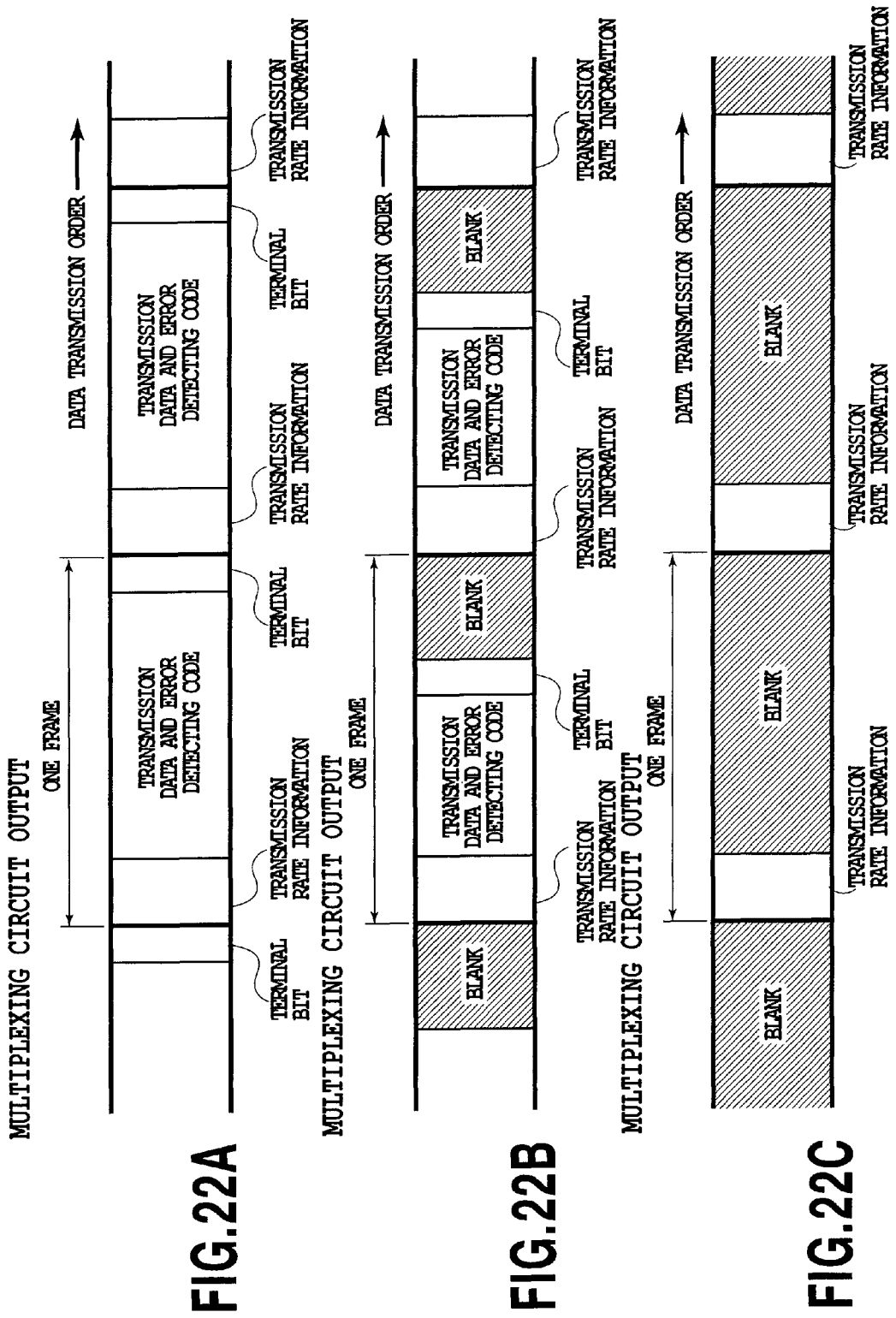

DATA TRANSMISSION METHOD, DATA TRANSMISSION SYSTEM, TRANSMITTING METHOD, RECEIVING METHOD, TRANSMITTING APPARATUS AND RECEIVING APPARATUS

TECHNICAL FIELD

The present invention relates to data transmission methods, data transmission systems, transmitting methods, receiving methods, transmitting apparatuses and receiving apparatuses for transmitting variable length transmission data by including them in frames each having a fixed time length.

BACKGROUND ART

In a data transmission method that converts information such as an audio signal to digital data and carries out the transmission, an amount of information of the signal to be transmitted is not always fixed in terms of time, but generally varies every moment.

Thus, by dividing the transmission data into individual frames of a fixed time length and carrying out data transmission with a variable number of bits for each frame, it is possible to vary the transmission rate in terms of time, and to transmit the required information during each frame period efficiently. In this case, the transmitting apparatus need not perform useless transmission, and hence can hold down the power consumption of the apparatus.

To achieve the data transmission with varying data transmission rate, it is generally necessary for a receiving side to get information about the transmission rate of each frame by some means. In this case, the following methods have been devised conventionally: a method of transmitting rate information directly transmitted as part of the frame data and making at the receiving side a rate decision from the rate information; and a method (blind rate detecting method) of making at the receiving side a rate decision, without transmitting the rate information, using error detecting code (such as CRC (Cyclic Redundancy Check) code) which is added to the transmission data for indicating communication quality (for example, see Patent Document 1 relating to an application of the present assignee).

On the other hand, in a communication environment causing a lot of transmission errors such as data transmission via a radio transmission channel, an improvement of the transmission quality is generally performed by error correction (FEC: Forward Error Correction) of the transmission data. As the error correcting code and error correcting decoding, a maximum likelihood decoding method such as convolution code and Viterbi decoding is used.

Here, in the method of making the rate decision at the receiving side using the error detecting code added to the transmission data for indicating communication quality without transmitting the rate information, the decision error rate in the rate decision depends on a word length of the error detecting code. In addition, even if the transmission error decreases, it cannot be reduced below a certain predetermined erroneous rate decision rate (probability of making a decision that no transmission error occurred when the rate is wrong).

On the other hand, the method that transmits the rate information from a transmitting side to the receiving side cannot make a decision as to the effective length of the data in a receiving frame if an error occurs during transmission. Thus, even if the data portion includes no error, it becomes difficult for the receiving side to reproduce the transmission data correctly.

In view of this, a method has been devised conventionally that improves the erroneous rate decision rate using likelihood information at the maximum likelihood decoding, and thus varies the transmission rate of each frame during communication more positively (for example, see Patent Document 2 relating to an application of the present applicant).

To improve the rate detecting performance (to reduce the erroneous detection probability of the rate) at the receiving side, the foregoing Patent Documents 1 and 2 describe a method of transmitting the CRC code with placing it at a fixed position in each frame (at the first position of the frame, for example), while CRC code has been conventionally added to the end of the transmission data at the transmitting side (in this case, the position of the CRC code in the frame varies in accordance with the bit length of the transmission data).

FIG. 1A and FIG. 1B are diagrams illustrating conventional transmission bit sequences. In one of the conventional methods ("postposition 1") that places the CRC code at the end of transmission data bits, the transmitting side transmits the transmission data in sequence of D9 (the most significant bit), . . . , D0 (the least significant bit), followed by the CRC code in sequence of C4 (the most significant bit), . . . , C0 (the least significant bit). The receiving side receives the bit string in this sequence. Then, it assumes the final bit position, and identifies (assumes) the portion corresponding to the CRC code and the portion corresponding to the transmission data according to the assumed final bit position.

According to the assumed transmission data and CRC code, the error detection is carried out. Among the assumed final bit positions, the final bit position is determined to be the position, at which the result of the error detection based on the assumed transmission data and CRC code indicates that no error has occurred.

More specifically, it calculates the CRC code again from the assumed transmission data, and if the CRC code agrees with the assumed CRC code, it determines that the assumed final bit position is the correct final bit position.

Alternatively, instead of calculating the CRC code again, it divides the bit string consisting of the assumed transmission data and assumed CRC code by the generator polynomial, which has been used for calculating the CRC code at the transmitting side. If the bit string is divisible, it makes a decision that no error has occurred, and hence that the assumed final bit position is the correct final bit position. If the bit string is indivisible, it makes a decision that some error has occurred, and hence that the assumed final bit position is not the correct final bit position.

Here, if it detects the position, for example, one bit less than the correct rate position, that is, if it assumes the position one bit shorter than the correct final bit position as the final bit position, a code word row is consecutive such as D1, D0, C4-C1 at the receiving side. Thus, even when no transmission bit error has occurred, the CRC decision result is OK at a probability of 50% (that is, erroneous detection). Likewise, at the position 2 bits less, the CRC decision result is OK at the probability of 25%, and at the position 3 bits less, it is OK at the probability of 12.5%.

FIG. 2 is a diagram illustrating an example of the transmitted signal and received signal according to the conventional transmission bit sequence (postposition 1). In the example of FIG. 2, the transmitting side transmits "1 (the most significant bit), 0, 0, 0, 1, 0, 0, 1, 0, 0 (the least significant bit)" corresponding to the transmission data in this order, followed by transmitting "1 (the most significant bit), 0, 1, 1, 0 (the least significant bit)" corresponding to the CRC code in this order. The receiving side receives the bit string in this order.

The example of FIG. 2 encodes the 10-bit transmission data G(X) using a generator polynomial P(X). The generator polynomial P(X), transmission data G(X), CRC code R(X) calculated from them, and finally transmitted signal F1(X) are expressed as follows.

$$P(X) = X^5 + X^4 + X^2 + 1$$

$$G(X) = X^9 + X^5 + X^2$$

$$R(X) = X^4 + X^2 + X$$

$$F1(X) = X^5 G(X) + R(X)$$
$$= (X^{14} + X^{10} + X^7) + (X^4 + X^2 + X)$$

When the correct final bit position is assumed at the receiving side that receives such a transmitted signal, the received signal H1(X) can be expressed as follows.

$$H1(X) = X^{14} + X^{10} + X^7 + X^4 + X^2 + X$$

The received signal H1(X) is divisible by the generator polynomial P(X) as follows.

$$H1(X) = X^{14} + X^{10} + X^7 + X^4 + X^2 + X$$
$$= (X^5 + X^4 + X^2 + 1)(X^9 + X^8 + X^7 + X^3 + X^2 + X)$$
$$= P(X)(X^9 + X^8 + X^7 + X^3 + X^2 + X)$$

Thus, the receiving side makes a decision of no error, and hence determines the assumed position as the correct final bit position. The decision of the final bit position is correct.

On the other hand, when assuming the position one bit less than the correct final bit position as the final bit position, the received signal H1'(X) can be expressed as follows.

$$H1'(X) = X^{13} + X^9 + X^6 + X^3 + X + 1$$

The received signal H1'(X) is divisible by the generator polynomial P(X) as follows.

$$H1'(X) = X^{13} + X^9 + X^6 + X^3 + X + 1$$
$$= (X^5 + X^4 + X^2 + 1)(X^8 + X^7 + X^6 + X^2 + X + 1)$$
$$= P(X)(X^8 + X^7 + X^6 + X^2 + X + 1)$$

Thus, the receiving side makes a decision of no error, and hence determines the assumed position as the correct final bit position.

The decision of the final bit position is an error. That is, it is an erroneous detection.

To solve such a problem in that the probability of the erroneous detection increases as the assumed position approaches the correct rate position, the foregoing Patent Document 1 and 2 conceive a method of placing the CRC code at the initial position of the frame ("preposition"). In this method, as shown in (preposition of) FIG. 1B, the code word row is inconsecutive like D1, C4-C1 at the receiving side. Accordingly, the foregoing problem does not occur, and a low erroneous detection probability, which is determined by the word length of the CRC code, can be obtained constantly from the detecting position close to the correct rate position through a distant detecting position.

However, to always transmit the CRC code with placing it at the initial position of the frame at the transmitting side in practice, that is, to transmit the CRC code placing it before the transmission data, it is necessary to store all the bits of the transmission data temporarily in a memory until the calculation of the error detecting code for the transmission data is completed. Such a buffer memory demands a large capacity in proportion to the number of bits of the transmission data in one frame. Thus, to transmit an enormous amount of transmission data, the scale of the hardware becomes a problem.

To solve such problem, Patent Documents 3 and 4 relating to applications of the present applicant describe a method of placing the error detecting code (such as CRC code) after the transmission data, and conducting the transmission placing the bit series of the transmission data and that of the error detecting code in inverse order.

In Patent Documents 3 and 4, the error detecting code is placed after the transmission data, and the R-bit series of the error detecting code before the final bit position is rearranged in inverse order, where R is equal to the number of bits C of the error detecting code.

FIG. 3A and FIG. 3B are examples illustrating the conventional transmission bit sequences. According to the placements of the inventions described in Patent Documents 3 and 4 ("postposition 2"), the sequence of the CRC code is rearranged in inverse order at the transmitting side. Thus, the transmission data is transmitted in the order of D9 (the most significant bit), . . . , D0 (the least significant bit), followed by transmitting the CRC code in the order of C0 (the least significant bit), . . . , C4 (the most significant bit).

The receiving side receives the bit string in this order. Then, it assumes the final bit position, and according to the assumed final bit position, it identifies (assumes) the portion corresponding to the CRC code and the portion corresponding to the transmission data, and rearranges the portion corresponding to the CRC code in inverse order. After that, the processing is the same as that of the foregoing "postposition 1".

According to the method of Patent Documents 3 and 4, the receiving side decides the CRC code as C3-C0, D0 which is obtained by rearranging D0, C0-C3 in inverse order. As a result, the code word sequence at the receiving side becomes inconsecutive, such as . . . , D1, C3, . . . , C0, D0. Thus, it is possible to prevent the problem in which the erroneous detection probability increases as the detecting position approaches the correct rate position, and to obtain a low erroneous detection probability, which is determined by the word length of the CRC code, constantly from the detecting position close to the correct rate position through the distant detecting position as in the case where the CRC code is placed before the transmission data.

In addition, since the arrangement according to the inventions described in Patent Documents 3 and 4 places the CRC after the transmission data, it can eliminate the need for providing the buffer for temporarily storing the transmission data while maintaining the high rate detecting performance as mentioned above, thereby allowing implementation in a hardware component with a small circuit scale.

FIG. 4 is a diagram illustrating an example of the transmitted signal and received signal according to conventional transmission bit sequence (postposition 2). In the example of FIG. 4, the transmitting side transmits "1 (the most significant bit), 0, 0, 0, 1, 0, 0, 1, 0, 0 (the least significant bit)" corresponding to the transmission data in this order, followed by "0 (the least significant bit), 1, 1, 0, 1 (the most significant bit)" corresponding to the CRC code rearranged in inverse order in this order. The receiving side receives the bit string in this order.

The example of FIG. 4 encodes 10-bit transmission data G(X) using a generator polynomial P(X) in the same manner as that of FIG. 2. As for the CRC code R(X) calculated, the processing is the same as that of FIG. 2. As for the transmitted signal F2(X), however, the CRC code is rearranged in inverse order as follows.

$$F2(X)=(X^{14}+X^{10}+X^7)+(X^3+X^2+1)$$

When the receiving side, which receives such a transmitted signal, assumes the correct final bit position, the received signal H2(X) can be expressed as follows.

$$H2(X)=X^{14}+X^{10}+X^7+X^3+X^2+1$$

As for the received signal H2(X), rearranging the CRC code portion in inverse order gives the following expression.

$$K2(X)=X^{14}+X^{10}+X^7+X^4+X^2+X$$

The expression K2(X) is equivalent to the foregoing H1(X), and is divisible by the generator polynomial P(X) as follows.

$$\begin{aligned} K2(X) &= X^{14} + X^{10} + X^7 + X^4 + X^2 + X \\ &= (X^5 + X^4 + X^2 + 1)(X^9 + X^8 + X^7 + X^3 + X^2 + X) \\ &= P(X)(X^9 + X^8 + X^7 + X^3 + X^2 + X) \end{aligned}$$

Thus, the receiving side makes a decision that no error has occurred, and that the assumed position is the correct final bit position. The decision as to the final bit position is correct.

On the other hand, if the position one bit shorter than the correct final bit position is assumed as the final bit position, the received signal H2'(X) can be expressed as follows.

$$H2'(X)=X^{13}+X^9+X^6+X^2+X$$

As for the received signal H2'(X), rearranging the CRC code portion in inverse order gives the following expression.

$$K2'(X)=X^{13}+X^9+X^6+X^3+X^2$$

The expression K2'(X) is indivisible by the generator polynomial P(X) as follows.

$$\begin{aligned} K2'(X) &= X^{13} + X^9 + X^6 + X^3 + X^2 \\ &= (X^5 + X^4 + X^2 + 1)(X^8 + X^7 + X^6 + X^2 + X + 1) + \\ &\quad (X^2 + X + 1) \\ &= P(X)(X^8 + X^7 + X^6 + X^2 + X + 1) + (X^2 + X + 1) \end{aligned}$$

Thus, the receiving side makes a decision that an error has occurred, and hence does not make a decision that the assumed position is the correct final bit position.

In this way, an erroneous detection of the final bit position can be prevented.

Patent Document 1: International Patent Laid-Open No. 96/26582 pamphlet.

Patent Document 2: International Patent Laid-Open No. 97/50219 pamphlet.

Patent Document 3: International Patent Laid-Open No. 00/79720 pamphlet.

Patent Document 4: Japanese Patent Laid-Open No. 2002-158642.

DISCLOSURE OF THE INVENTION

FIG. 5 is a diagram illustrating a conventional transmission bit sequence (postposition 2). As described above, in the method described in Patent Documents 3 and 4 (postposition 2), the error detecting code is placed after the transmission data, and the R-bit series before the final bit position of the error detecting code is rearranged in inverse order, where R is equal to the number of bits C of the error detecting code. In the example of FIG. 5, R=C=5.

However, even if R differs from C, an erroneous detection due to the foregoing consecutiveness of the sequence can be prevented.

In the method described in Patent Documents 3 and 4, which makes R equal to C, once the CRC word length (C bits) used is determined, the optimum value of the rate error detection rate, which is obtained as a result of transmitting the CRC code portion in inverse order, is determined uniquely based on the CRC code length. Accordingly, when the transmission frame (block) error rate, which is required in the variable rate data transmission, is very small (indicating high quality), the foregoing method cannot satisfy the prescribed error rate (quality), and is assumed to hit bottom (lay the floor) at the error rate corresponding to the rate erroneous detection rate. Here, the transmission frame (block) error rate is assumed to be the sum of the probability that the transmission error is detected by the CRC determination and the probability that the transmission rate is erroneously detected and the CRC decision is OK (no transmission error).

In addition, when a variable rate data block size required for the service and necessary quality are given, it is sometimes impossible to simultaneously optimize the CRC code length and the rate erroneous detection rate that satisfy them. This presents a problem in that the CRC code length becomes redundant and the erroneous detection rate is stuck at a high level.

To solve the foregoing problems, the number of bits R to be rearranged in inverse order can be made different from, and greater than the number of bits C of the error detecting code.

FIG. 6 is a diagram illustrating an example in which the number of bits R to be rearranged in inverse order is made greater than the number of bits C of the error detecting code (CRC code) to carry out transmission. In the example of FIG. 6, the R-bit series (R>C) before the final bit position of the CRC code is rearranged in inverse order.

FIG. 7 is a diagram illustrating the processing at the receiving side for the transmission of FIG. 6. The receiving side assumes a possible final bit position, and assumes (identifies) the transmission data and CRC code. More specifically, it assumes the transmission data and error detecting code on the presumption that the error detecting code is placed after the transmission data, and the R-bit series before the final bit position of the error detecting code is rearranged in inverse order.

FIG. 7 illustrates an example of the processing that assumes the position one bit shorter than the correct bit position as the final bit position. After carrying out the inverse rearrangement corresponding to the inverse rearrangement the transmitting side performs, the receiving side assumes 5 bits C3-C0, D2 as the CRC code, and the portion before that, that is, the portion D9-D3, D0, C4 as the transmission data.

Then, according to the assumed transmission data and CRC code, it carries out the error detection. Among the final bit positions assumed, it determines that the position, at which the error detection carried out based on the assumed transmission data and CRC code results in no error, is the final bit position.

The example of FIG. 7 can prevent the erroneous detection based on the foregoing consecutiveness of the sequence because the bit series after the receiving side rearranges it in inverse order becomes inconsecutive, such as . . . , D3, D0, . . . , C0, D2.

In addition, when the transmission data is short in a particular frame, and the number of bits R to be rearranged in inverse order is greater than the sum of the number of bits T of the transmission data and the number of bits C of the CRC code, it is possible to rearrange only the sum (T+C) bits in inverse order exceptionally. Specifically, it is possible to rearrange from the final bit position of the error detecting code through the initial bit position of the transmission data in inverse order. The receiving side only needs to rearrange the T+C bits only in inverse order if the result R>T+C is obtained by assuming the final bit position.

Incidentally, the number of bits R to be rearranged in inverse order can be made smaller than the number of bits C of the error detecting code.

FIG. 8 is a diagram illustrating an example that makes the number of bits R to be rearranged in inverse order smaller than the number of bits C of the error detecting code (CRC code) to carry out the transmission. In the example of FIG. 8, the R-bit series (R<C) before the final bit position of the CRC code is rearranged in inverse order.

FIG. 9 is a diagram illustrating the processing at the receiving side for the transmission of FIG. 8. The receiving side assumes a possible final bit position, and assumes (identifies) the transmission data and CRC code. More specifically, it assumes the transmission data and error detecting code on the presumption that the error detecting code is placed after the transmission data, and the R-bit series before the final bit position of the error detecting code is rearranged in inverse order.

FIG. 9 illustrates an example of the processing that assumes the position one bit shorter than the correct bit position as the final bit position. After carrying out the inverse rearrangement corresponding to the inverse rearrangement the transmitting side performs, the receiving side assumes 5 bits D0, C4, C3, C0, C2 as the CRC code, and the portion before that, that is, the portion D9-D1 as the transmission data.

Then, according to the assumed transmission data and CRC code, it carries out the error detection. Among the final bit positions assumed, it determines that the position, at which the error detection carried out based on the assumed transmission data and CRC code results in no error, as the final bit position.

The example of FIG. 9 can prevent the erroneous detection based on the foregoing consecutiveness of the sequence because the bit series after the receiving side rearranges it in inverse order becomes inconsecutive, such as . . . , C3, C0, C2.

In this way, in the variable rate data transmission, transmitting with rearranging an arbitrary R-bit series before the final bit position of the error detecting code in inverse order allows such adjustment that enables desired rate error detection.

In addition, making R greater than the number of bits C of the error detecting code can achieve the rate erroneous detection rate lower than that when R is placed at R=C, thereby enabling higher quality variable rate data transmission. Accordingly, it is not necessary to lengthen the error detecting code at the cost of the transmission efficiency.

Furthermore, making R smaller than C enables the inverting processing to be simpler than when R is placed at R=C.

A data transmitting method in accordance with the present invention is a data transmission method that makes transmission by including variable length transmission data into each frame that has a fixed time length, and comprises: at a transmitting side, a step of calculating an error detecting code of the transmission data in each frame; a step of placing the calculated error detecting code after the transmission data in each frame, and generating frame data by rearranging an R-bit series before a final bit position of the error detecting code in inverse order in each frame; and a step of transmitting the generated frame data, and at a receiving side, a step of receiving the frame data; a step of assuming the transmission data and the error detecting code for the received frame data by assuming a final bit position of the frame data in each frame; a step of making a determination in each frame that, among the assumed final bit positions of the frame data, a position that is determined to be errorless as a result of error detection carried out on a basis of the assumed transmission data and error detecting code is the final bit position of the frame data; and a step of obtaining the transmission data on a basis of the determination result in each frame, wherein the step of assuming the transmission data and error detecting code assumes the transmission data and error detecting code in each frame on a presumption that the error detecting code is placed after the transmission data, and the R-bit series before the final bit position of the error detecting code is rearranged in inverse order; and the R is a natural number equal to or greater than 2, and is greater or smaller than the number of bits of the error detecting code.

Here, the R can be made greater than the number of bits of the error detecting code.

A data transmission system in accordance with the present invention is data transmission system that makes transmission by including variable length transmission data into each frame that has a fixed time length, and comprises: in a transmitting side apparatus, means for calculating an error detecting code of the transmission data in each frame; means for placing the calculated error detecting code after the transmission data in each frame, and generating frame data by rearranging an R-bit series before a final bit position of the error detecting code in inverse order in each frame; and means for transmitting the generated frame data, and in a receiving side apparatus, means for receiving the frame data; means for assuming the transmission data and the error detecting code for the frame data received by assuming a final bit position of the frame data in each frame; means for making a determination in each frame that among the assumed final bit positions of the frame data, a position that is determined to be errorless as a result of error detection carried out on a basis of the assumed transmission data and error detecting code is the final bit position of the frame data; and means for obtaining the transmission data on a basis of the decision result in each frame, wherein the means for assuming the transmission data and error detecting code assumes the transmission data and error detecting code in each frame on a presumption that the error detecting code is placed after the transmission data, and the R-bit series before the final bit position of the error detecting code is rearranged in inverse order; and the R is a natural number equal to or greater 2 one, and is greater or smaller than the number of bits of the error detecting code.

Here, the R can be made greater than the number of bits of the error detecting code.

A transmitting method in accordance with the present invention is a data transmitting method that makes transmission by including variable length transmission data into each frame that has a fixed time length, and comprises: a step of calculating an error detecting code of the transmission data in each frame; a step of placing the calculated error detecting code after the transmission data in each frame, and generating frame data by rearranging an R-bit series before a final bit position of the error detecting code in inverse order in each frame; and a step of transmitting the generated frame data, wherein the R is a natural number equal to or greater than 2, and is greater or smaller than the number of bits of the error detecting code.

A receiving method in accordance with the present invention is a receiving method that receives frame data in which an error detecting code calculated about variable length transmission data is placed after the transmission data in each frame that has a fixed time length, and in which an R-bit series before a final bit position of the error detecting code is rearranged in inverse order in each frame, and that comprises: a step of receiving the frame data; a step of assuming the transmission data and the error detecting code for the received frame data by assuming a final bit position of the frame data in each frame; a step of making a decision in each frame that among the assumed final bit positions of the frame data, a position that is determined to be errorless as a result of error detection carried out on a basis of the assumed transmission data and error detecting code is the final bit position of the frame data; and a step of obtaining the transmission data on a basis of the decision result in each frame, wherein the step of assuming the transmission data and error detecting code assumes the transmission data and error detecting code in each frame on the presumption that the error detecting code is placed after the transmission data, and the R-bit series before the final bit position of the error detecting code is rearranged in inverse order; and the R is a natural number equal to or greater than 2, and is greater or smaller than the number of bits of the error detecting code.

A transmitting apparatus in accordance with the present invention is a transmitting apparatus that makes transmission by including variable length transmission data into each frame that has a fixed time length, and comprises: means for calculating an error detecting code of the transmission data in each frame; means for placing the calculated error detecting code after the transmission data in each frame, and generating frame data by rearranging an R-bit series before a final bit position of the error detecting code in inverse order in each frame; and means for transmitting the generated frame data, wherein the R is a natural number equal to or greater than 2, and is greater or smaller than the number of bits of the error detecting code.

A receiving apparatus in accordance with the present invention is a receiving apparatus that receives frame data in which an error detecting code calculated about variable length transmission data is placed after the transmission data in each frame that has a fixed time length, and in which an R-bit series a final bit position of the error detecting code is rearranged in inverse order in each frame, and that comprises: means for receiving the frame data; means for assuming the transmission data and the error detecting code for the frame data received by assuming a final bit position of the frame data in each frame; means for making a determination in each frame that among the assumed final bit positions of the frame data, a position that is determined to be errorless as a result of error detection carried out on a basis of the assumed transmission data and error detecting code is the final bit position of the frame data; and means for obtaining the transmission data on a basis of the decision result in each frame, wherein the means for assuming the transmission data and error detecting code assumes the transmission data and error detecting code in each frame on the presumption that the error detecting code is placed after the transmission data, and the R-bit series before the final bit position of the error detecting code is rearranged in inverse order; and the R is a natural number equal to or greater than 2, and is greater or smaller than the number of bits of the error detecting code.

According to the present invention, by transmitting after rearranging an arbitrary R-bit series before the final bit position of the error detecting code in inverse order, it is possible to make adjustment that enables desired rate erroneous detection in the variable rate data transmission.

In addition, by making R greater than the number of bits C of the error detecting code, a rate erroneous detection rate lower than that when R=C can be achieved, thereby enabling higher quality variable rate data transmission. Accordingly, it becomes unnecessary to increase the error detecting code length at the cost of the transmission efficiency.

Furthermore, by making R smaller than C, simplification of the processing of rearranging in inverse order can be achieved as compared with the case where R=C.

BRIEF DESCRIPTION OF THE DRAWINGS

FIG. 1A is a diagram illustrating an example of a conventional transmission bit sequence;

FIG. 1B is a diagram illustrating an example of a conventional transmission bit sequence;

FIG. 2 is a diagram illustrating an example of a transmitted signal and a received signal based on the conventional transmission bit sequence;

FIG. 3A is a diagram illustrating an example of a conventional transmission bit sequence;

FIG. 3B is a diagram illustrating an example of a conventional transmission bit sequence;

FIG. 11A is a diagram illustrating an example of a frame structure of the transmission data in the first embodiment in accordance with the present invention;

FIG. 11B is a diagram illustrating an example of the frame structure of the transmission data in the first embodiment in accordance with the present invention;

FIG. 16A is a flowchart illustrating another example of the rate decision processing in the first embodiment in accordance with the present invention;

FIG. 22A is a diagram illustrating an example of a frame structure of the transmission data in a fifth embodiment in accordance with the present invention;

FIG. 22B is a diagram illustrating an example of the frame structure of the transmission data in the fifth embodiment in accordance with the present invention;

FIG. 22C is a diagram illustrating an example of the frame structure of the transmission data in the fifth embodiment in accordance with the present invention;

BEST MODE FOR CARRYING OUT THE INVENTION

The best mode for carrying out the invention will now be described with reference to the accompanying drawings.

First Embodiment

Figure 10A:
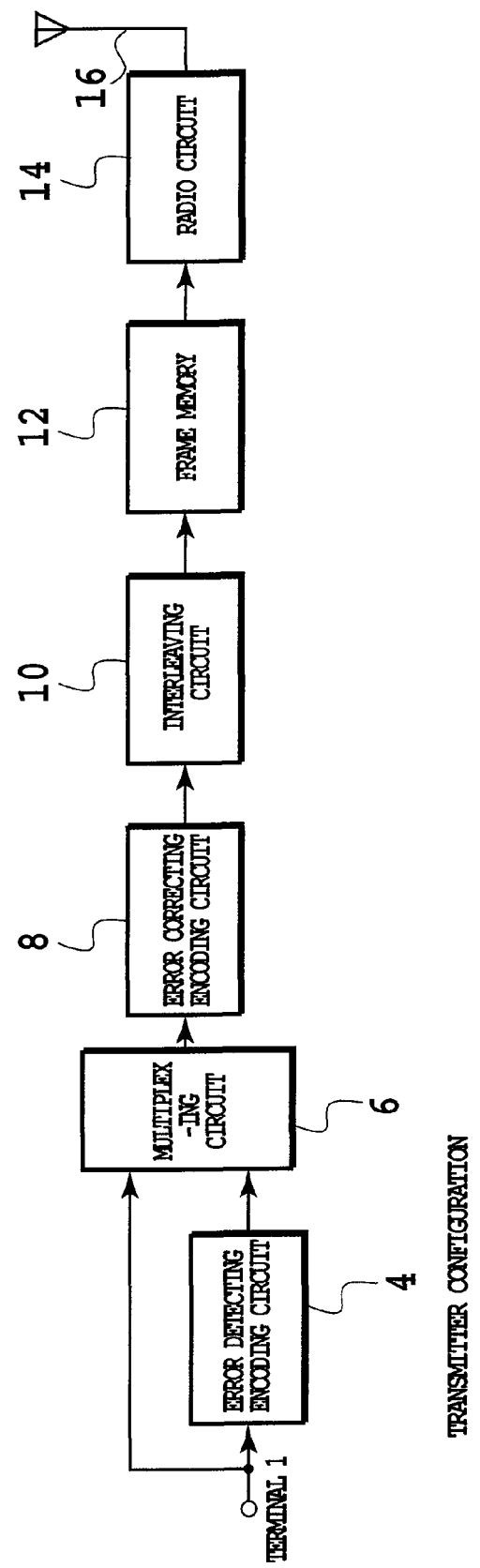
FIG. 10A is a block diagram showing a configuration of a transmitter and receiver of a first embodiment in accordance with the present invention.
Figure 10B:
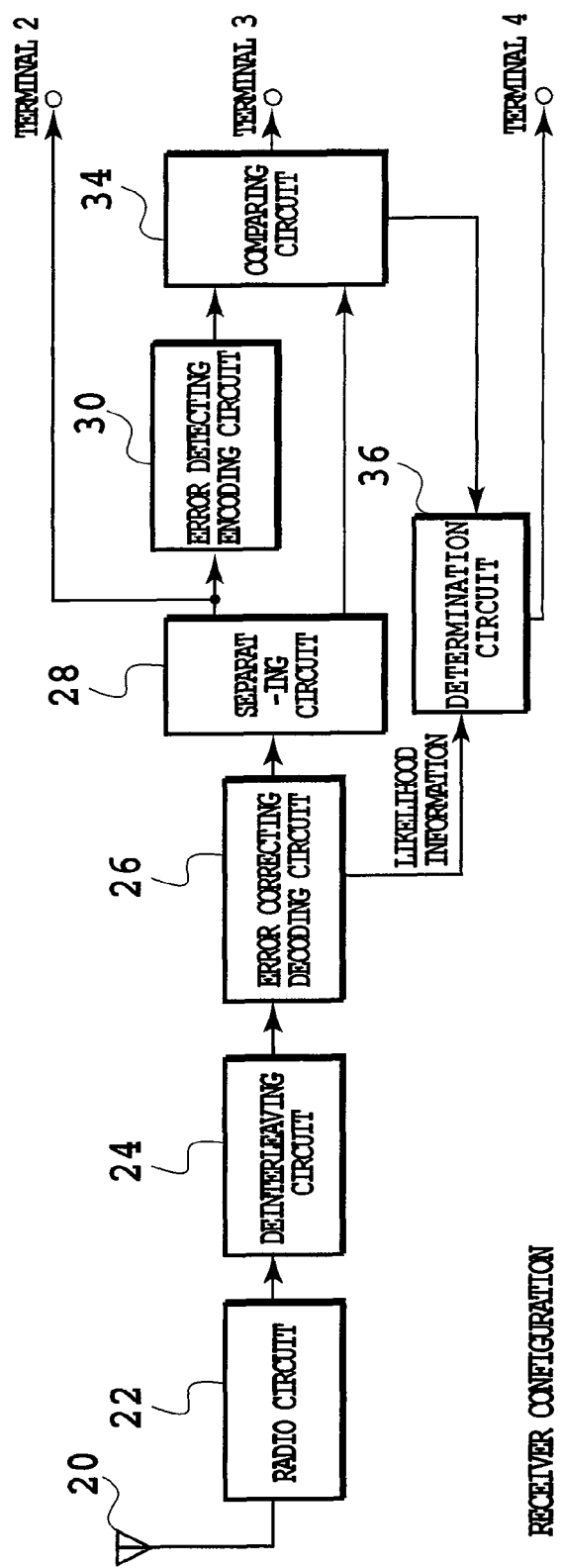
FIG. 10B is a block diagram showing a configuration of the transmitter and receiver of the first embodiment in accordance with the present invention.

FIG. 10A and FIG. 10B are block diagrams showing a configuration of a transmitter and receiver of a first embodiment in accordance with the present invention.

In FIG. 10A and FIG. 10B, a transmission data sequence applied to a terminal 1 is delivered to an error detecting encoding circuit 4 and a multiplexing circuit 6. The error detecting encoding circuit 4 calculates an error detecting code (CRC code (CRC (parity) bits) in the present embodiment) for each frame of the transmission data. Here, the term "error detecting code (CRC code)" refers to an additional bit portion to the transmission data, or a parity bit equivalence. In the present embodiment, the word length of the CRC code has a fixed length.

Next, the multiplexing circuit 6 places the error detecting code that the error detecting encoding circuit 4 calculated after the transmission data. Then, it rearranges an R-bit series before the final bit position of the error detecting code in inverse order, where R is a natural number equal to or greater than 2, and can be either greater or smaller than the number of bits of the error detecting code.

The present embodiment carries out the error correcting encoding by a convolution code. Thus, the multiplexing circuit 6 adds a terminal bit, which is necessary for the error correcting decoding, to the transmission data and error detecting code, and sequentially outputs frame by frame.

Figure 4:
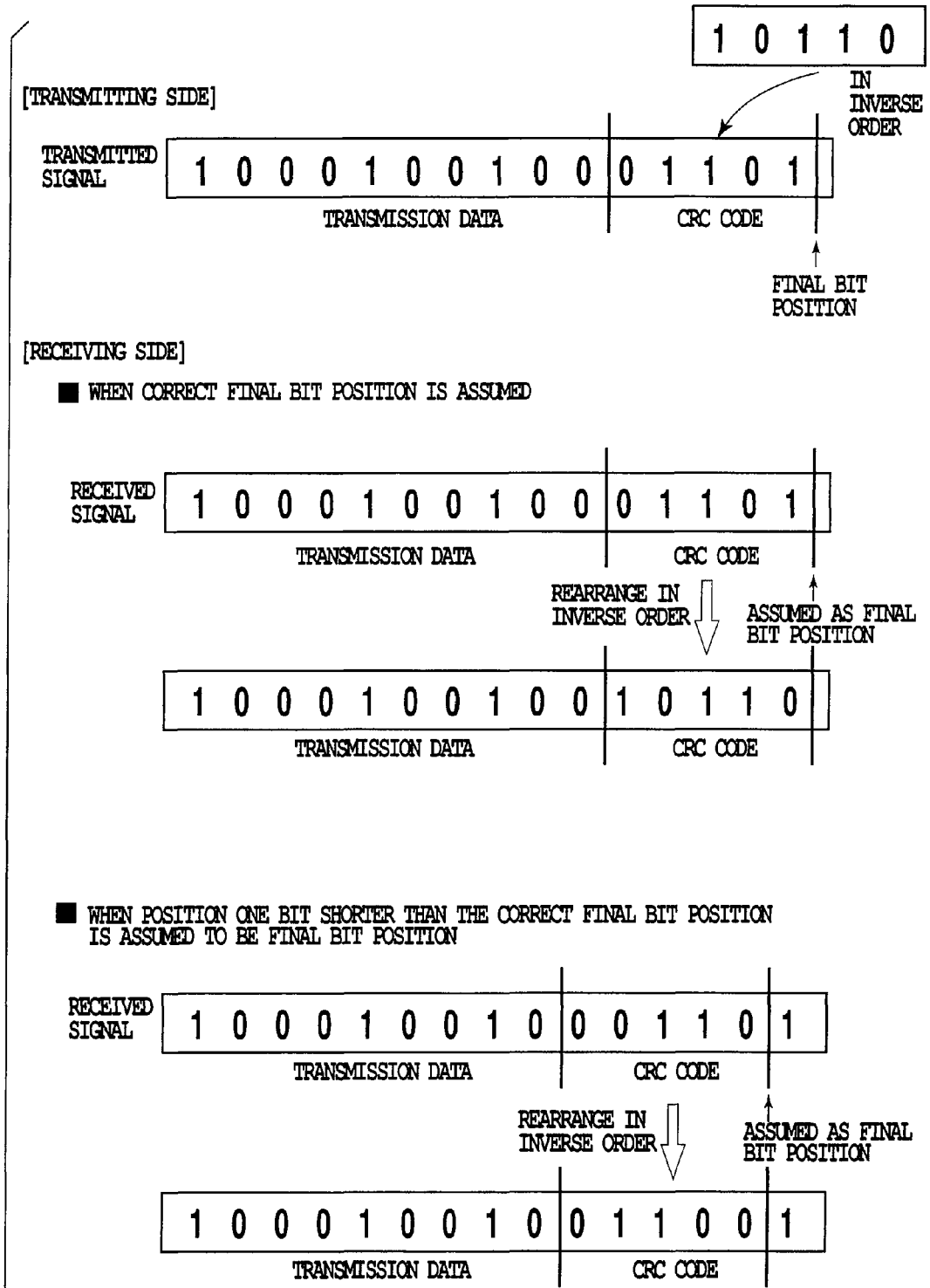
FIG. 4 is a diagram illustrating an example of a transmitted signal and a received signal based on the conventional transmission bit sequence.
Figure 5:
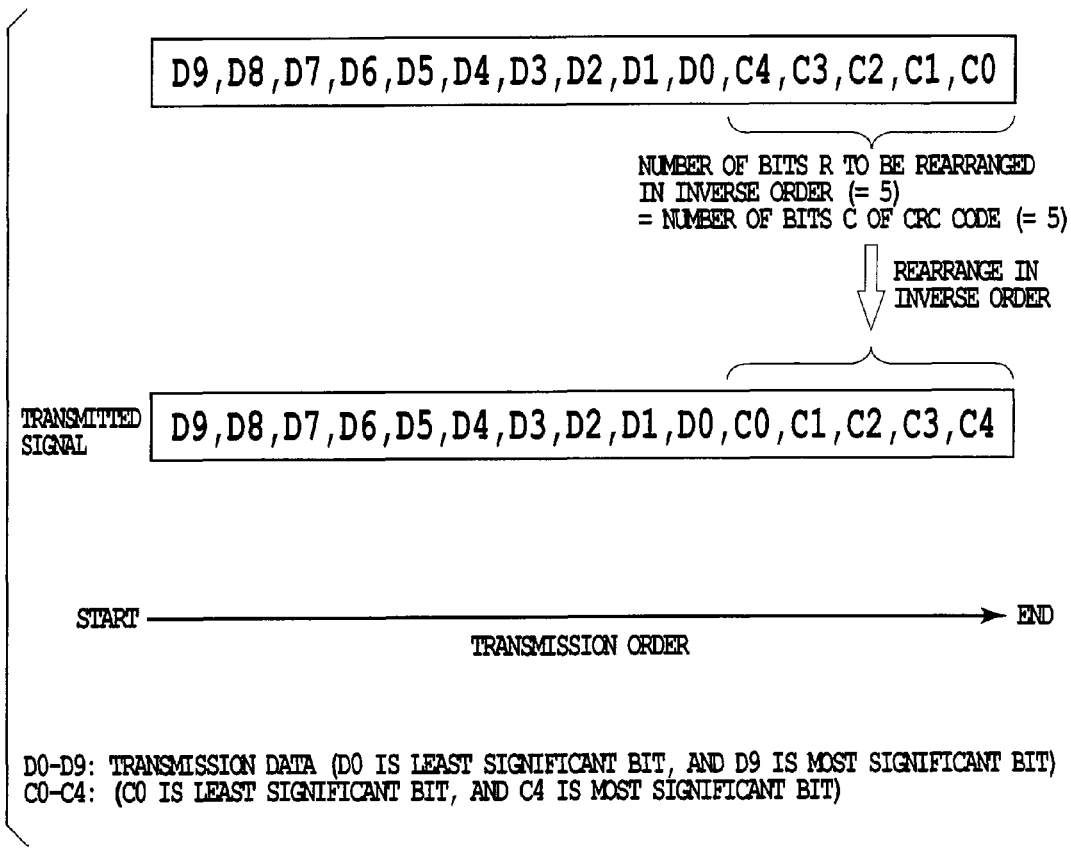
FIG. 5 is a diagram illustrating a conventional transmission bit sequence.
Figure 6:
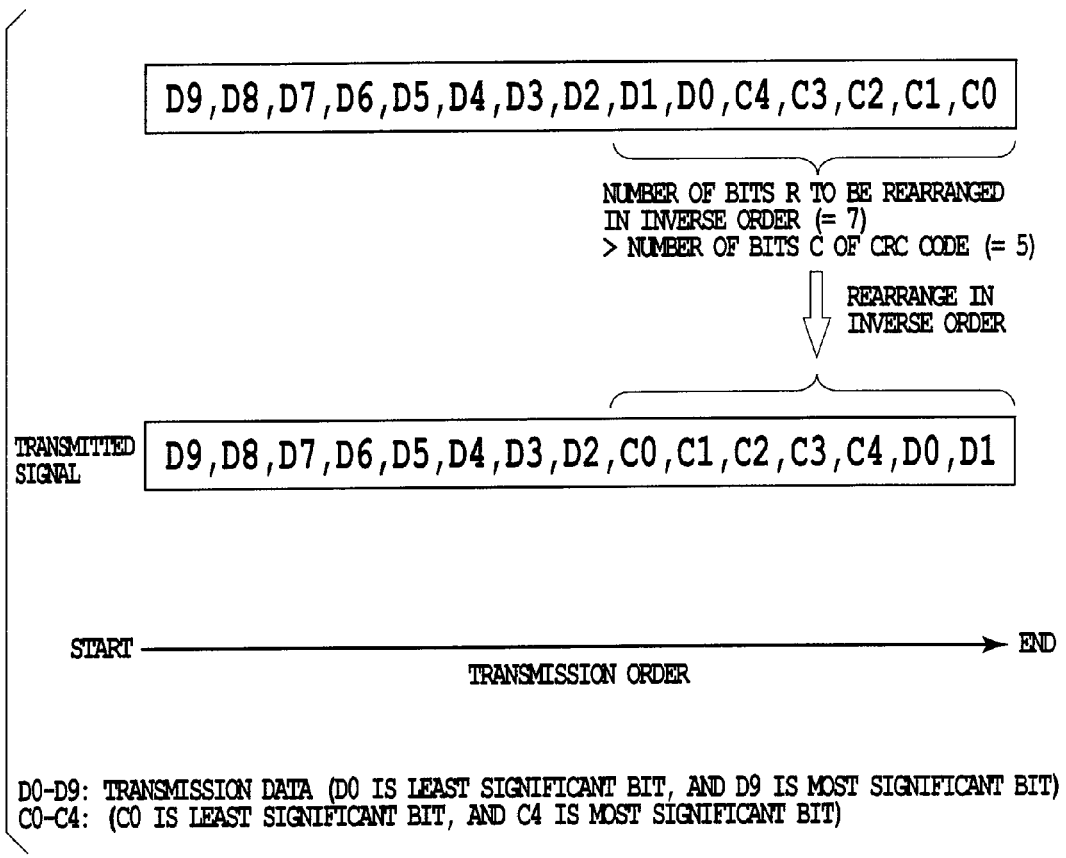
FIG. 6 is a diagram illustrating an example of transmission where the number of bits R to be rearranged in inverse order is made greater than the number of bits C of the error detecting code (CRC code)
Figure 7:
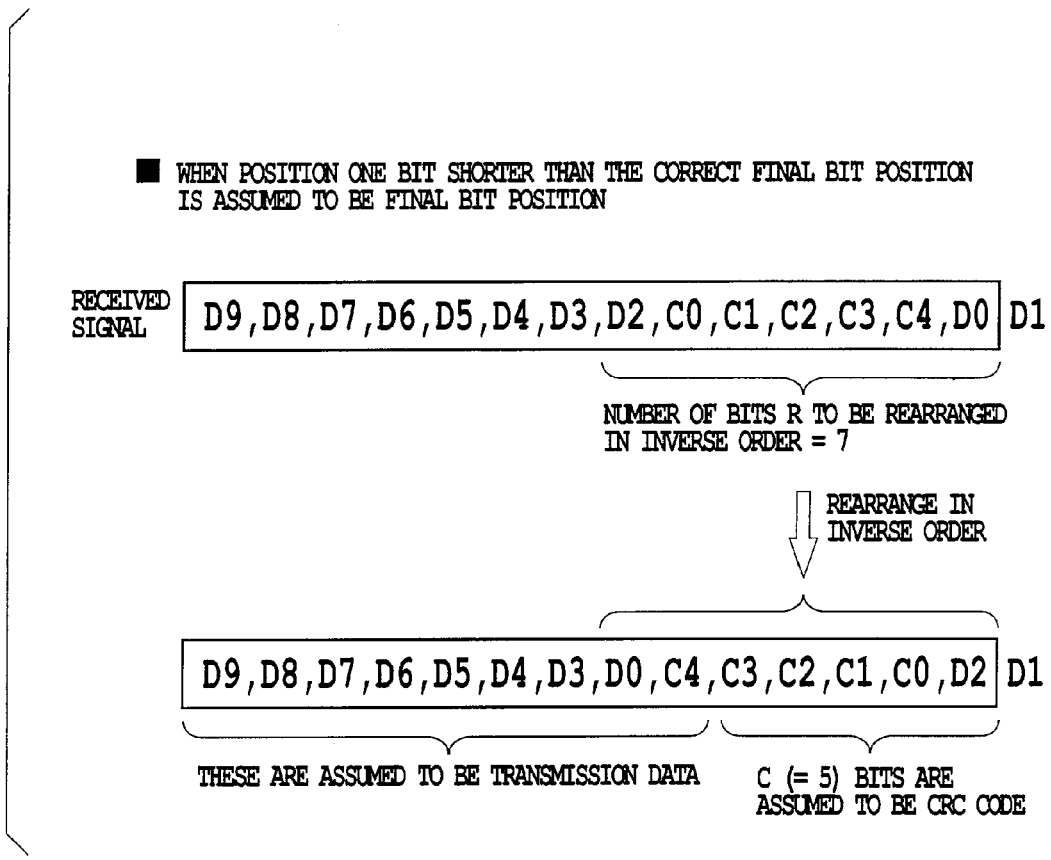
FIG. 7 is a diagram illustrating the processing at a receiving side for the transmission of FIG. 6.
Figure 8:
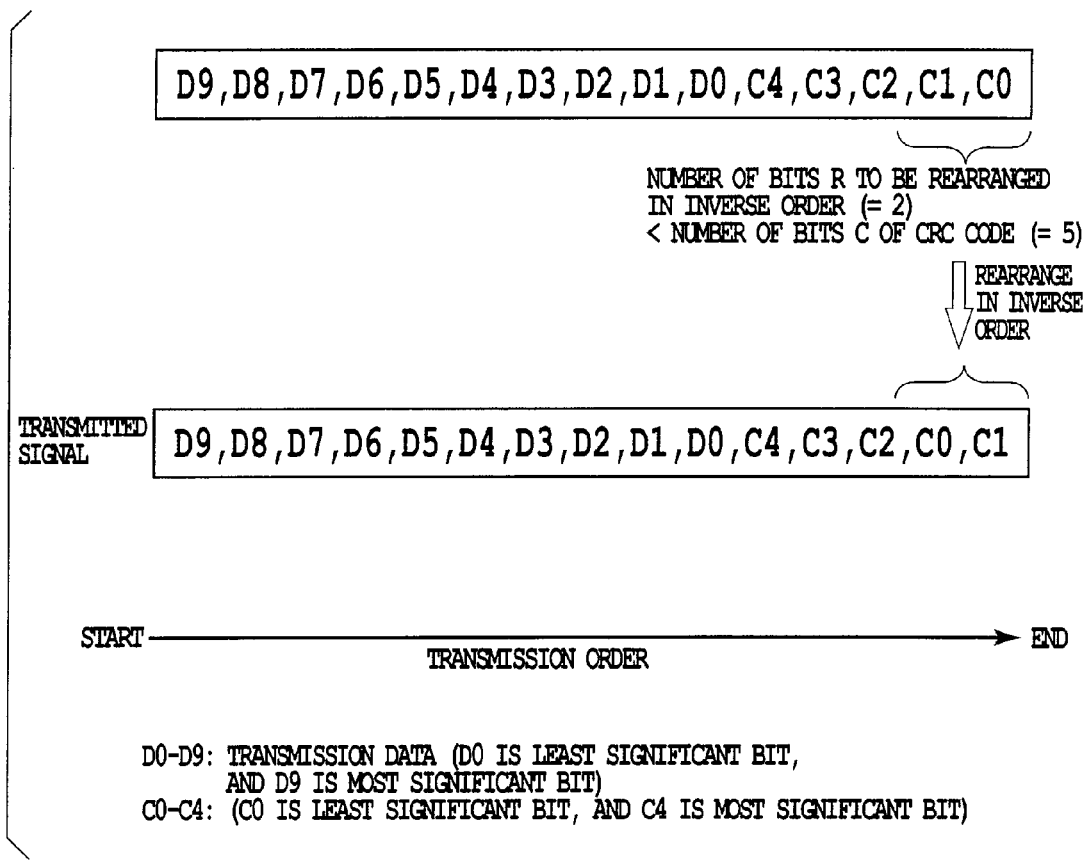
FIG. 8 is a diagram illustrating an example of transmission where the number of bits R to be rearranged in inverse order is made smaller than the number of bits C of the error detecting code (CRC code)
Figure 9:
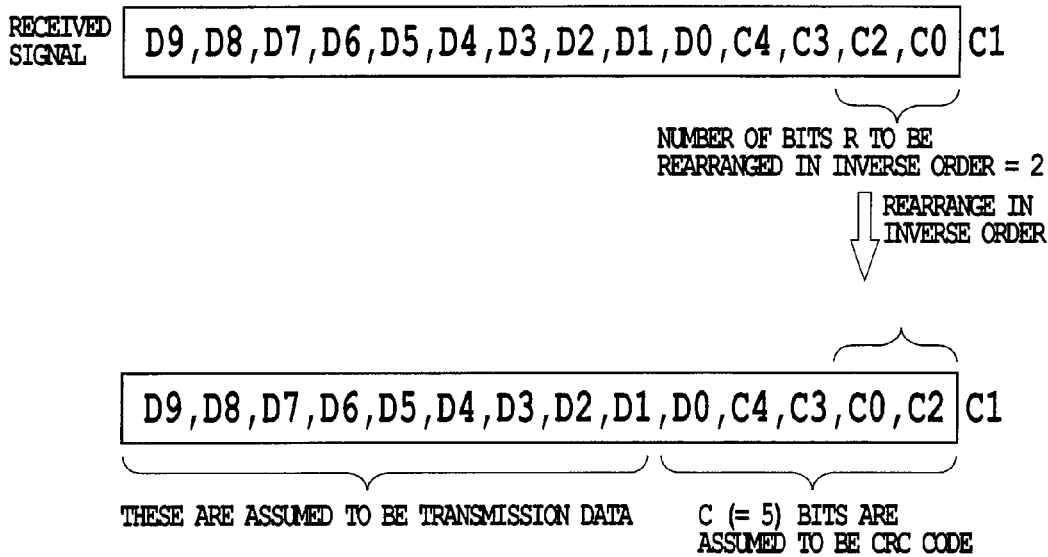
FIG. 9 is a diagram illustrating the processing at a receiving side for the transmission of FIG. 8.

FIG. 11A and FIG. 11B illustrate examples of the data sequence output from the multiplexing circuit 6. Here, FIG. 11A illustrates an example where the transmission rate of the transmission data is maximum, and FIG. 11B illustrates a case where the transmission rate is less than the maximum rate. When transmitted at less than the maximum rate, the frame has a vacant time (time without data). A concrete example of the portions indicated as "transmission data and error detecting code" in FIG. 11A and FIG. 11B is a bit string indicated as the "transmitted signal" in FIG. 6 and FIG. 8.

The data sequence output from the multiplexing circuit 6 is subjected to the convolution encoding by an error correcting encoding circuit 8, sent to an interleaving circuit 10 for interleaving.

Figure 12:
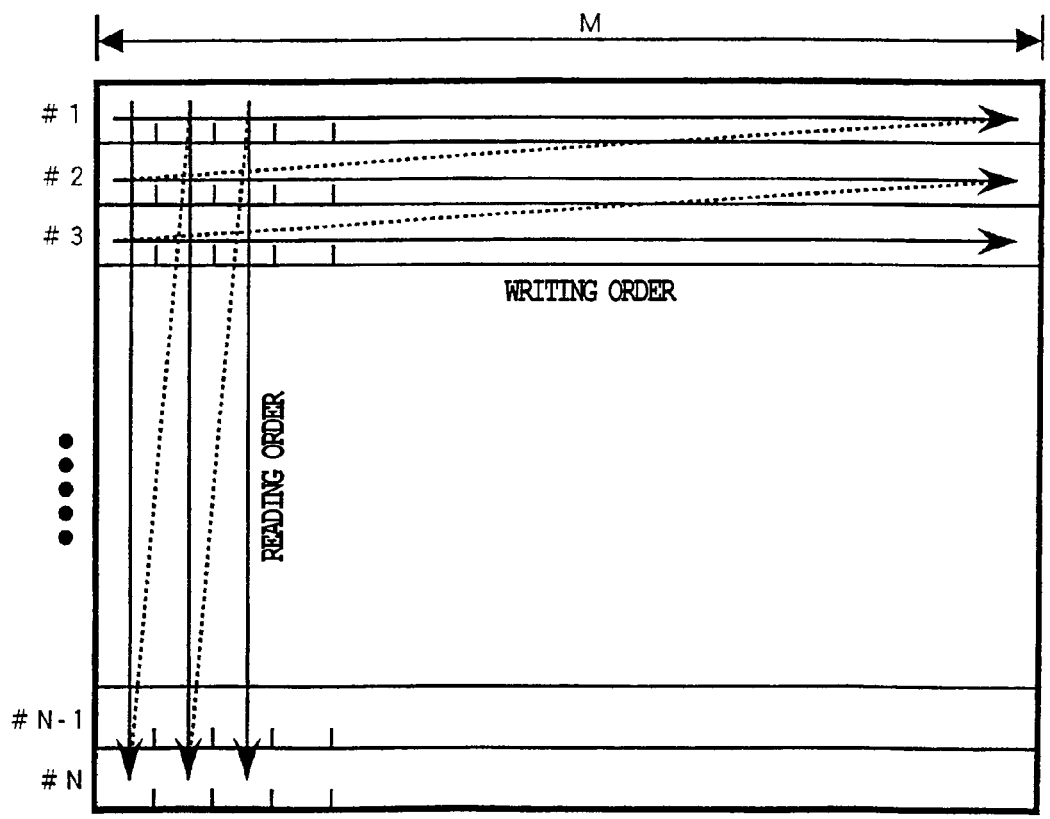
FIG. 12 is a diagram illustrating a processing example of an interleaving circuit in the first embodiment in accordance with the present invention.

FIG. 12 illustrates an example of the interleaving in the interleaving circuit 10. A data sequence of one frame is output in a direction different from the direction of input, that is, the transmission data input in the row direction is output in the column direction. As for another example of interleaving, the interleaving described in Japanese Patent Laid-Open No. 11-129056/1999 filed by the present applicant can be cited as an example. The data sequence output from the interleaving circuit 10 is written in a frame memory 12.

Figure 13:
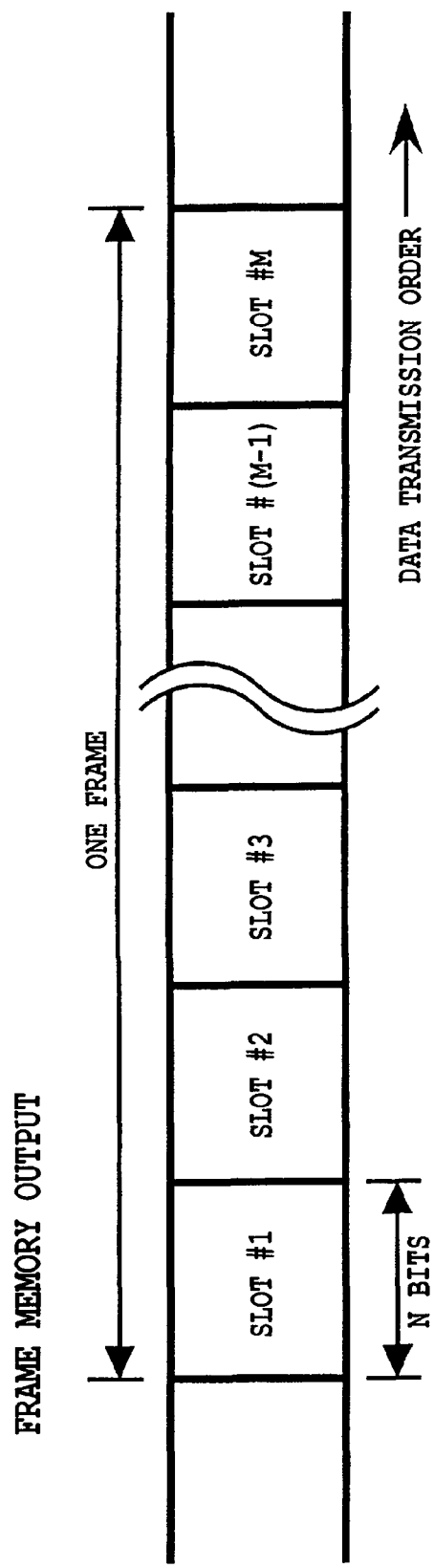
FIG. 13 is a diagram illustrating an example of the frame structure of the transmission data in the first embodiment in accordance with the present invention.

FIG. 13 illustrates an example of a frame structure of the data sequence output from the frame memory 12. A data stretch corresponding to the row of the interleaving circuit 10 is called a slot. It is assumed here that one slot consists of N bits and one frame consists of M slots. Accordingly, the number of bits of each frame is N×M bits.

The output data sequence of the frame memory 12 is modulated by a radio circuit 14, and is transmitted via an antenna 16. As a modulation scheme, spectrum spreading modulation, QPSK modulation or the like is used. It is assumed here that the modulation is not carried out in data positions corresponding to vacant portions in the slots. Thus, the transmitter will transmit data with a variable number of bits in a fixed frame time.

Next, in the receiver, a radio circuit 22 demodulates a received signal fed from an antenna 20, and sequentially supplies it to a deinterleaving circuit 24. The deinterleaving circuit 24 has an internal memory, and reads out data inverting the order of input and output at the interleaving circuit 10 on the transmitting side. That is, the deinterleaving circuit 24 writes the data in the memory column by column (slot by slot) and reads out row by row. Such operation can restore the original data sequence of one frame, and the encoded transmission data sequence and error detecting code appear. The object of the foregoing interleaving and deinterleaving is to further improve the error correction effect by preventing burst-like continuous errors.

The deinterleaved data sequence is delivered to an error correcting decoding circuit 26 to be subjected to error correcting decoding using a maximum likelihood decoding method. The decoded data sequence is divided into the error detecting code and data sequence by a separating circuit 28, and the error detecting code is supplied to a comparing circuit 34.

On the other hand, the data sequence is output from the terminal 2 as the received data, and is supplied to an error detecting encoding circuit 30 at the same time. The error detecting encoding circuit 30 carries out the same error detecting encoding as that of the transmitter for the input data sequence, again. As for the error detecting code obtained by the re-encoding, the comparing circuit 34 compares it with the error detecting code bit by bit, and outputs a coincidence signal when all the code bits agree.

The calculation of the error correcting decoding and error detecting code is carried out while assuming the final bit position of the transmittable frame data successively for each frame. In this case, the error correcting decoding circuit 26 provides a rate decision circuit 36 with the likelihood information for the decoding result up to each assumed final bit position. According to the likelihood information and the coincidence signal of the error detecting codes, the rate decision circuit 36 determines the final bit position, that is, the transmission rate of the frame.

Figure 14:
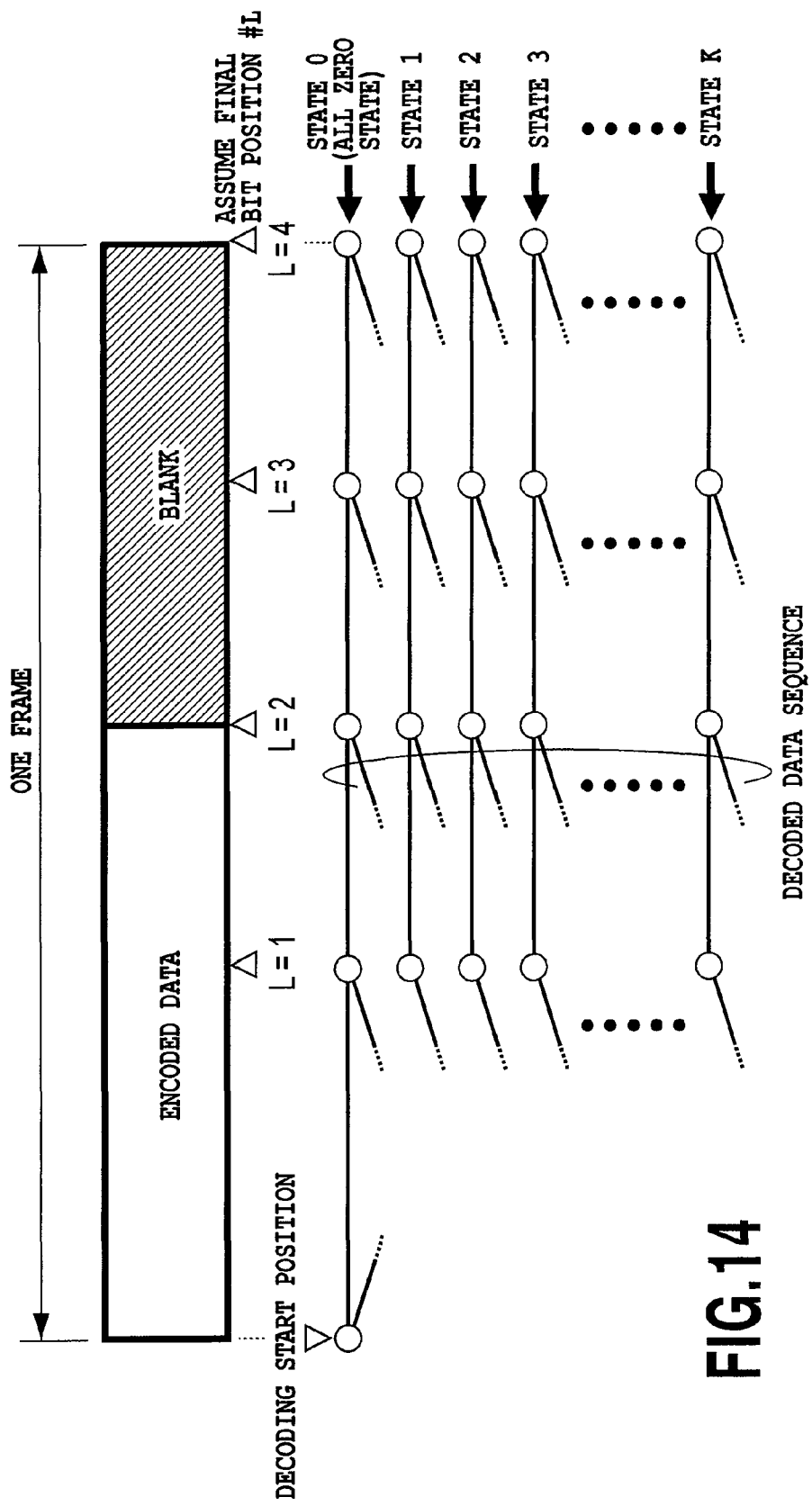
FIG. 14 is a diagram illustrating an example of a decoded data sequence at the maximum likelihood decoding in the first embodiment in accordance with the present invention.
Figure 15:
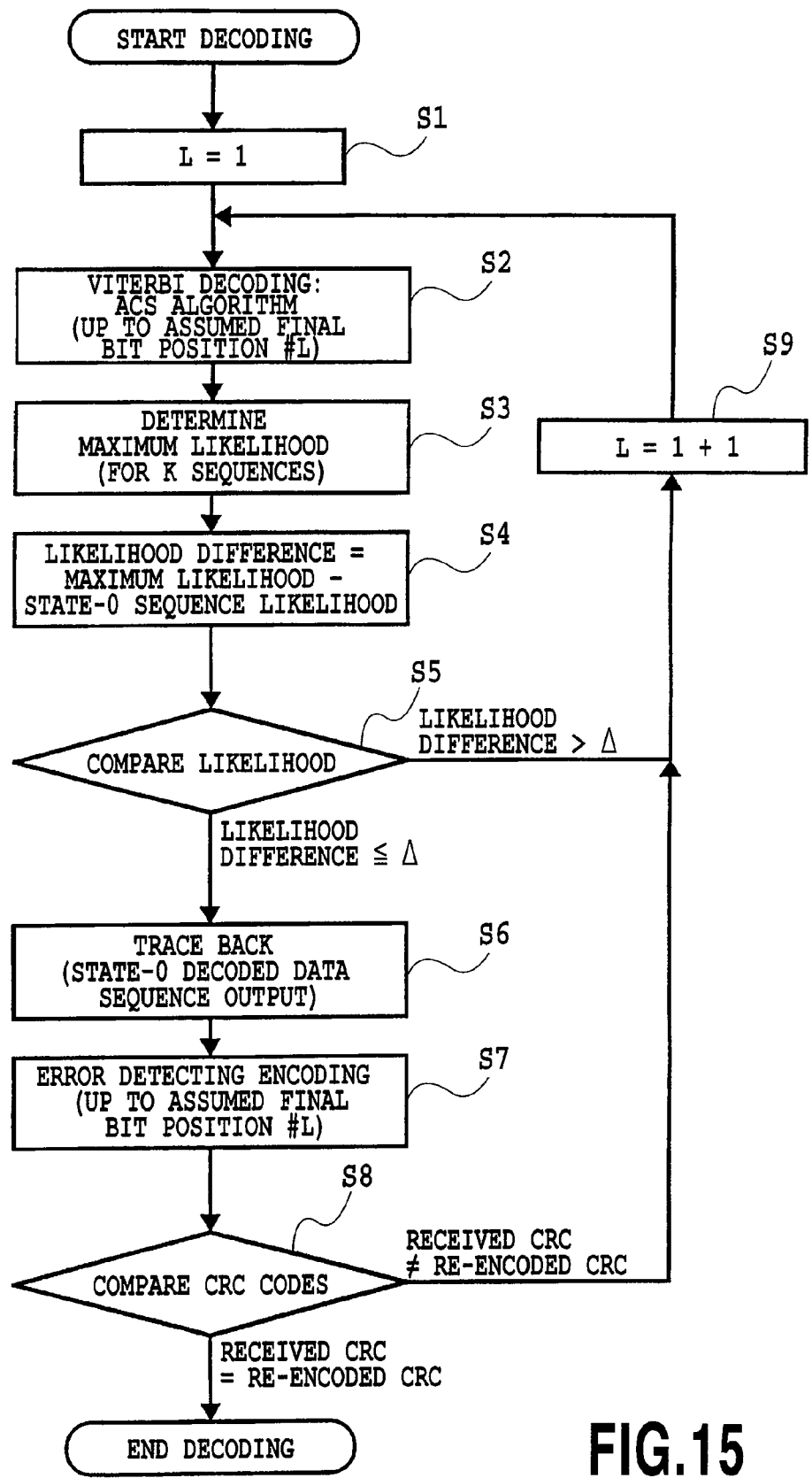
FIG. 15 is a flowchart illustrating an example of the rate decision processing in the first embodiment in accordance with the present invention.

FIG. 14 illustrates an example of the decoded data sequence at the maximum likelihood decoding, and FIG. 15 illustrates an example of the rate decision processing (algorithm). Here, the maximum likelihood decoding assumes Viterbi decoding.

First, after starting the Viterbi decoding, at the assumed final bit positions (#L in the example of FIGS. 14 and 15), the likelihood for each of the transmission data sequences of a plurality of decoded data sequences (K decoded data sequences reaching state 1 to state K in the example of FIG. 14) surviving into each state is obtained, and the difference between the maximum value of these likelihoods and the likelihood for the transmission data sequence of the decoded data sequence obtained by terminating the decoding process (the sequence leading to state 0 in FIG. 14) is obtained (S1-S4).

If the likelihood difference is within a fixed range (within Δ in the example of FIG. 15), the selected decoded data sequence is outputted by tracing back, and encoding of the error detecting code (CRC code) is carried out (S5 and S6).

The present embodiment has the error detecting code (CRC code) with a fixed word length, and has a frame structure that has the transmission data placed just before the error detecting code in the bit string that has passed through the rearrangement of the received signal in inverse order, which corresponds to the rearrangement in inverse order at the transmitting side. Accordingly, the (assumed) transmission data (portion) and (assumed) error detecting code (portion) are obtained for the assumed final bit position. In other words, assuming the final bit position is to assume the transmission data (portion) and error detecting code (portion). Then, the error detecting code (CRC code) is generated (again) for the obtained (assumed) transmission data.

When the re-encoded CRC agrees with the received CRC ((assumed) error detecting code) as a result of comparison, the decoding is completed. Then, the assumed final bit position is determined as the final bit position of the transmitted frame data, and the transmission data is obtained (restored).

If the likelihood difference exceeds Δ, or if the result of comparison of the CRCs does not agree, the Viterbi decoding is continued assuming the next position. If the calculation result of the Viterbi decoding and error detecting code for the assumed final bit position shows that the likelihood difference is within Δ and that a plurality of positions are detected at which the error detecting code comparing result indicates agreement, it is possible to decide the position at which the likelihood difference is minimum as the final bit position of the transmitted frame data. This will be described later.

In the example of FIG. 14, if no error has occurred during the transmission, it is expected that the sequence leading to state 0 at the second position (L=2) has the maximum likelihood (likelihood difference=0), and that the comparing result of the error detecting codes for the decoding sequence indicates agreement.

In contrast, if an error occurs during the transmission, the sequence that reaches state 0 does not always have the maximum likelihood. Thus, concerning the decoding sequence that had its error corrected, setting Δ at an appropriate value can achieve the same effect of reducing the erroneous rate decision rate as in the case where no error has occurred. In a region in which Δ is equal to or less than a particular value, setting Δ at a smaller value will enable further reduction of the average rate decision error while on the other hand increasing the average frame error rate (the probability that the comparing result of the CRCs disagrees+the erroneous rate determination rate).

Accordingly, as for the data transmission requiring a very low erroneous rate decision rate such as the control data, it is better to reduce Δ at the expense of the frame error rate to some extent.

Furthermore, considering a tendency of the occurrence of errors during the transmission, Δ can be set as a value obtained by multiplying a fixed value by a coefficient that is defined as the difference between the maximum value and the minimum value of the likelihoods that are obtained at each assumed final bit position.

Carrying out data transmission using the transmitter-receiver with the foregoing configuration enables the receiving side to receive the data even if the transmitting side does not transmit the information indicating the number of transmission bits in the frame directly to the receiving side, and even when the number of transmission bits in the frame (that is, apparent transmission rate) varies for each frame.

Thus, the receiving side can reduce the erroneous detection probability of the rate during the variable rate data transmission, and at the same time the transmitting side can eliminate the need for providing the buffer for temporarily storing the transmission data.

In addition, by employing the rate determination method that jointly uses the likelihood information at the Viterbi decoding, the possibility of outputting the transmission data of a wrong length in the frame due to an erroneous rate determination result can be reduced. This enables highly reliable variable rate data transmission.

As described above, if the result of the Viterbi decoding and the result of the error detecting code calculation for the assumed final bit position indicate that the likelihood difference is within Δ, and if a plurality positions are detected at which the result of comparison of the error detecting codes agrees, it is also possible to make a determination that the position at which the likelihood difference is minimum is the final bit position of the transmitted frame data.

Figure 16B:
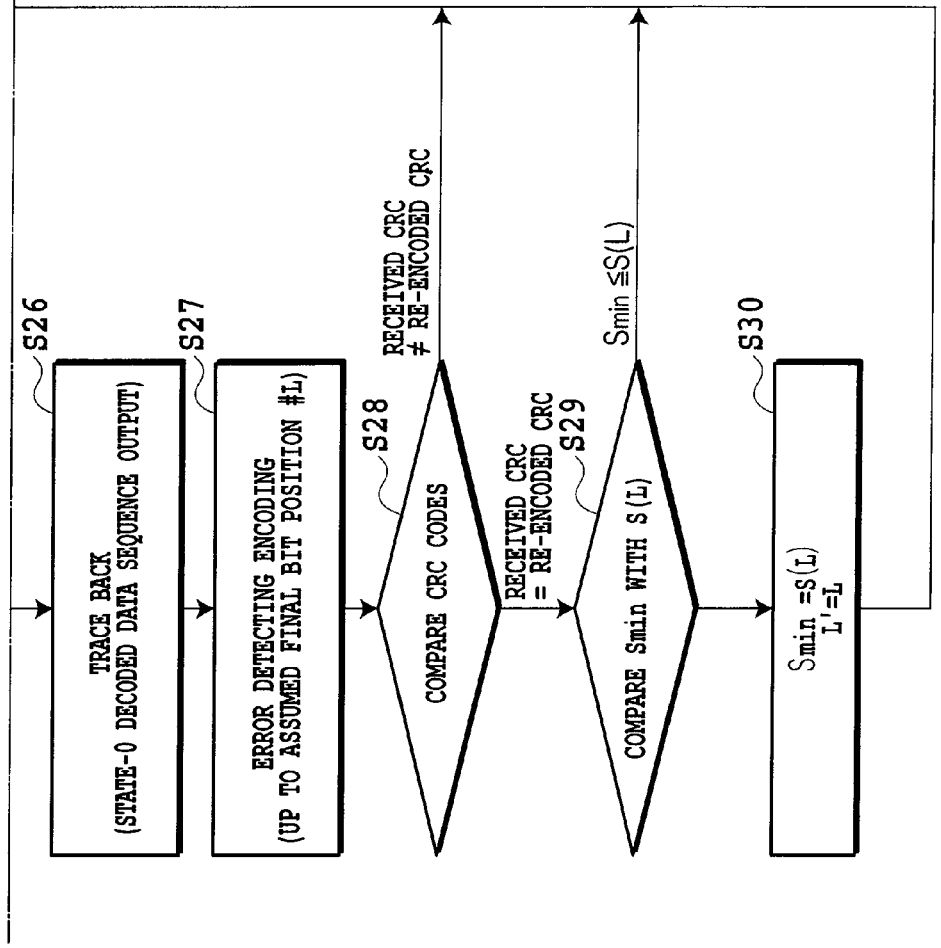
FIG. 16B is a flowchart illustrating another example of the rate decision processing in the first embodiment in accordance with the present invention.

FIG. 16A and FIG. 16B illustrate another example of the rate determination processing (algorithm). In the example of FIG. 16A and FIG. 16B, L is an assumed bit position. After carrying out general checking from the assumed first bit position (L=1; L=0 is also possible as will be described in the third embodiment) through the assumed last bit position (at step S31, a decision is made as to whether the assumed final bit position has been checked or not), the position having the minimum likelihood difference is determined to be the final bit position. In the course of this, a variable $S_{min}$ for storing the minimum likelihood difference and a variable L' for storing its position are used.

However, it is conceivable that there are cases where the likelihood difference is within Δ, but no position is detected at which the comparing result of the error detecting codes indicates agreement. In such cases, since L'=−1 (the value set at step S21) still holds even at step S33, it can be considered as an error, for example. Here, setting the value of Δ at infinity makes it possible to circumvent a situation in which no position is detected at which the likelihood difference is within Δ.

Although the present embodiment performs the error correcting encoding using the convolution code, it can also employ other methods such as carrying out the error correcting encoding using a turbo code. In addition, as the foregoing Patent Document 2, it can divide the frame data into a plurality of blocks, and carry out the error correcting encoding using a block code for each block.

Furthermore, the present embodiment carries out for the frame data the error correcting encoding and interleaving, and deinterleaving and error correcting decoding. However, even if it does not perform them, it can obviate the need for providing the buffer for temporarily storing the transmission data while reducing the probability of the erroneous detection of the rate in the variable rate data transmission. In this case, without using the likelihood information, it can simply decide among the final bit positions of the assumed frame data that the position, at which the assumed error detecting code agrees with the error detecting code calculated from the assumed transmission data, is the final bit position of the frame data.

Second Embodiment

Figure 17A:
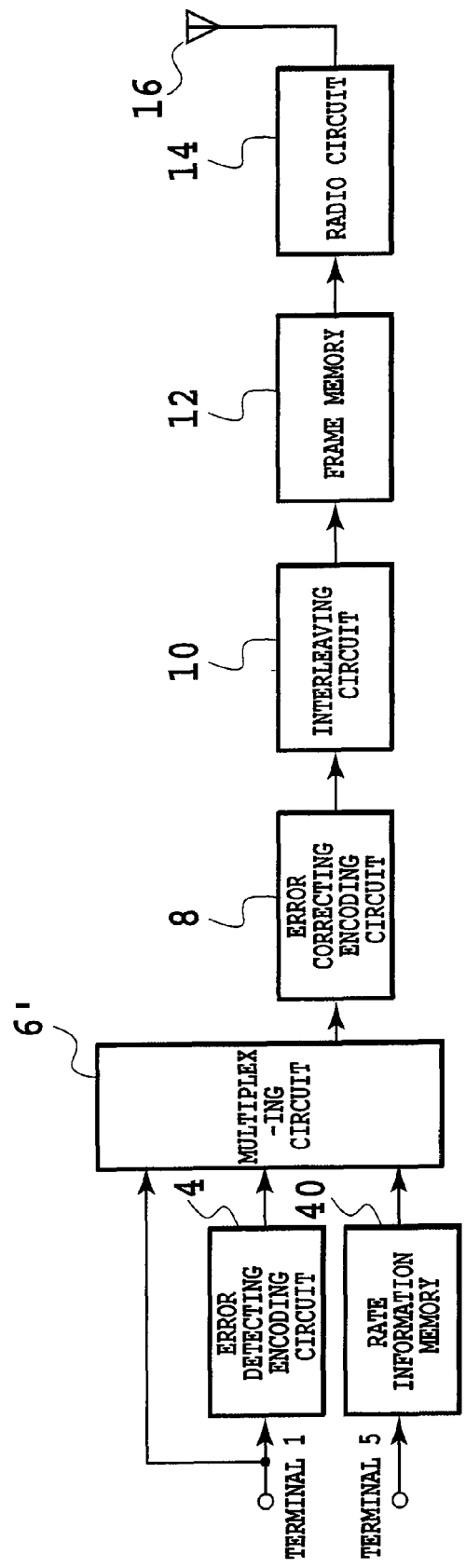
FIG. 17A is a block diagram showing a configuration of the transmitter and receiver in a second embodiment in accordance with the present invention.
Figure 17B:
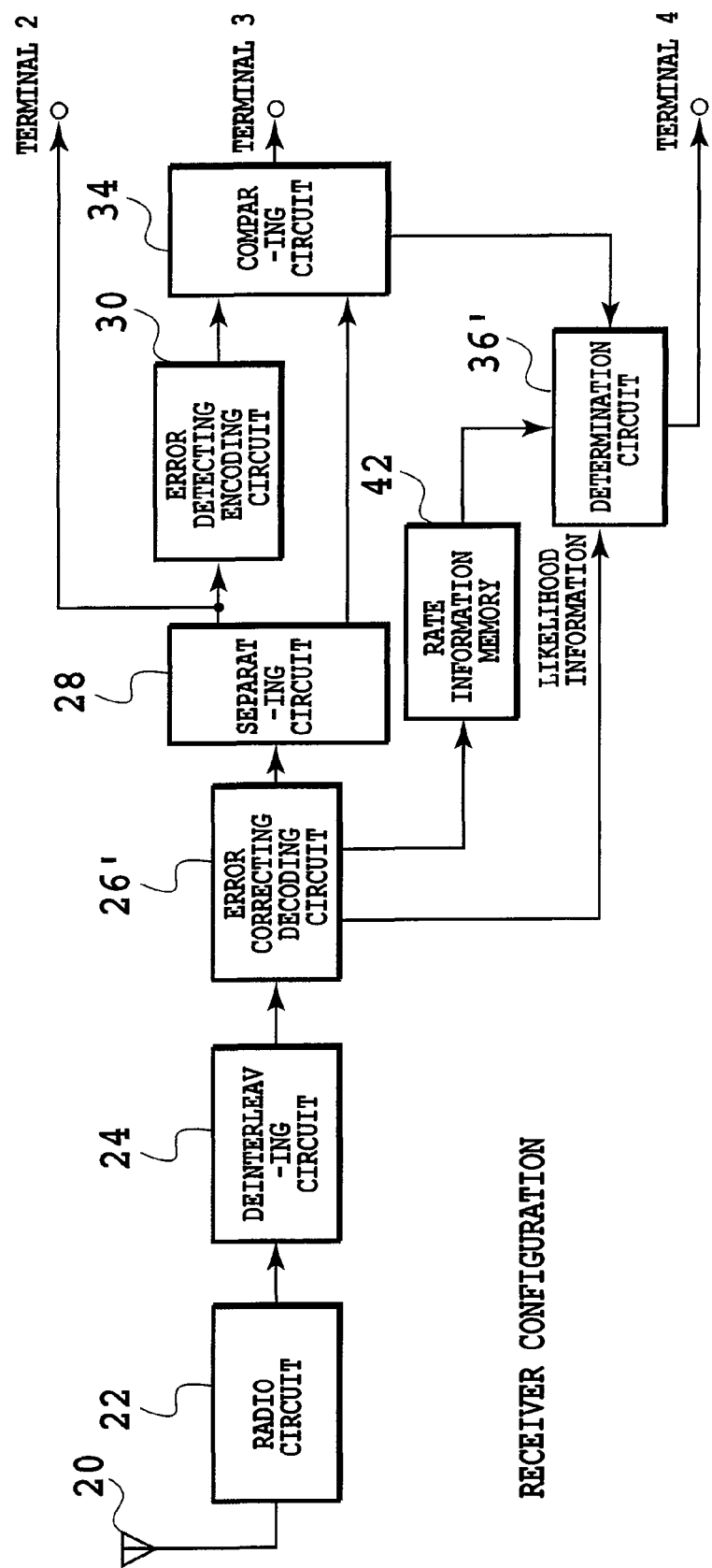
FIG. 17B is a block diagram showing the configuration of the transmitter and receiver in the second embodiment in accordance with the present invention.

FIG. 17A and FIG. 17B are block diagrams showing a configuration of the transmitter and receiver of a second embodiment in accordance with the present invention.

The configuration of FIG. 17A and FIG. 17B adds to the configuration of FIG. 10A and FIG. 10B the transmission of the information representing the rate of the transmission data, and has the receiving side carry out the rate determination using the rate information as well. In FIG. 17A and FIG. 17B, the same reference numerals designate the components common to those of FIG. 10A and FIG. 10B. Thus, the following description will be made with an emphasis on the operation of the portions different from those of FIG. 10A and FIG. 10B.

First, information (transmission rate information) that represents the rate of the transmission data and is applied to a terminal 5 is delivered to a rate information memory 40. Thus, the content of the rate information memory 40 is the rate information of the transmission data, that is, the information representing the number of bits. A multiplexing circuit 6' sequentially outputs the information representing the rate of the transmission data read out from the rate information memory 40, the transmission data transferred from the terminal 1, the error detecting code calculated by the error detecting encoding circuit 4, and the terminal bit on a frame by frame basis. Here, the error detecting code is also placed after the transmission data, and the R-bit series before the final bit position of the error detecting code is rearranged in inverse order. In the present embodiment, the transmission rate information is placed at the initial position of the frame.

Figure 18A:
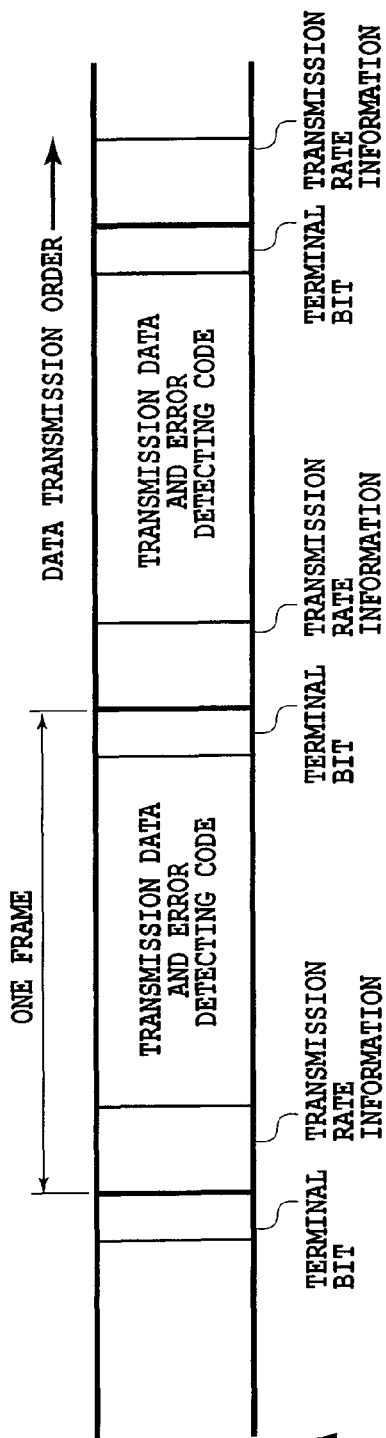
FIG. 18A is a diagram illustrating an example of a frame structure of the transmission data in the second embodiment in accordance with the present invention.
Figure 18B:
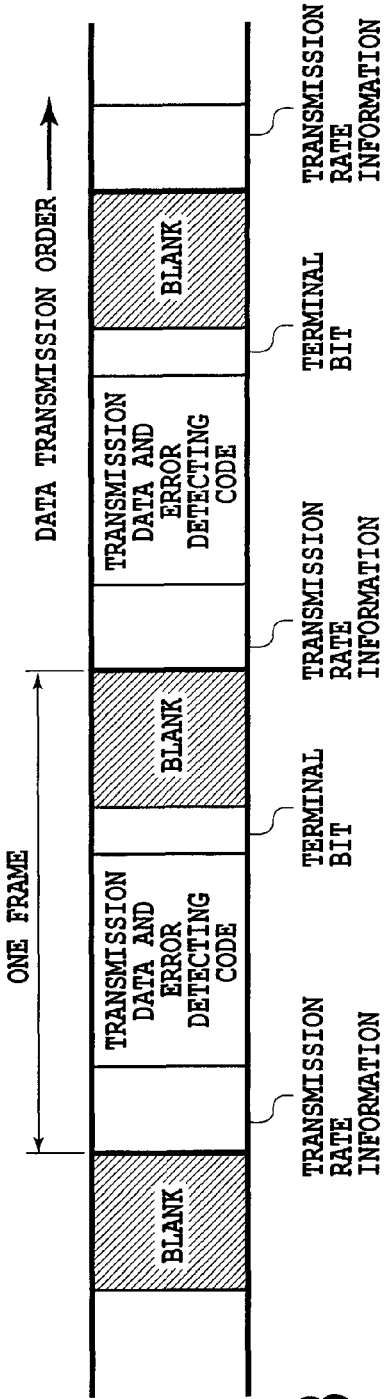
FIG. 18B is a diagram illustrating an example of the frame structure of the transmission data in the second embodiment in accordance with the present invention.

FIG. 18A and FIG. 18B illustrate examples of the data sequence output from the multiplexing circuit 6'.

In the present embodiment, as for the transmission rate information, the error correcting encoding circuit 8 carries out the error correcting encoding using a block code (as a concrete example of the error correcting code, a double orthogonal code, a Reed-Muller code and a BCH code can be given. In addition, error correcting encoding other than the error correcting encoding based on the block code can also be employed). As for the transmission data, error detecting code and terminal bit, it carries out the error correcting encoding using a convolution code. In addition, the interleaving circuit 10 independently or collectively carries out interleaving of these data that passed through the error correcting encoding. It is also possible for the error correcting encoding circuit 8 to carry out the error correcting encoding of the transmission rate information, transmission data, error detecting code and terminal bit all together using the convolution code.

In the receiver, on the other hand, when the transmission rate information has undergone the error correcting encoding carried out independently of the transmission data and the like using the block code, an error correcting decoding circuit 26' performs appropriate error correcting decoding for the transmission rate information portion, followed by storing the decoding result in a rate information memory 42. In contrast with this, when the transmission rate information, transmission data and others have undergone the convolution encoding all together, the error correcting decoding circuit 26' breaks off in the middle the successive Viterbi decoding, which has been started from the initial position of the frame, and at that point obtains the decoding result of the rate information bit portion placed at the initial position of the frame. The decoding result is stored in the rate information memory 42.

Figure 19:
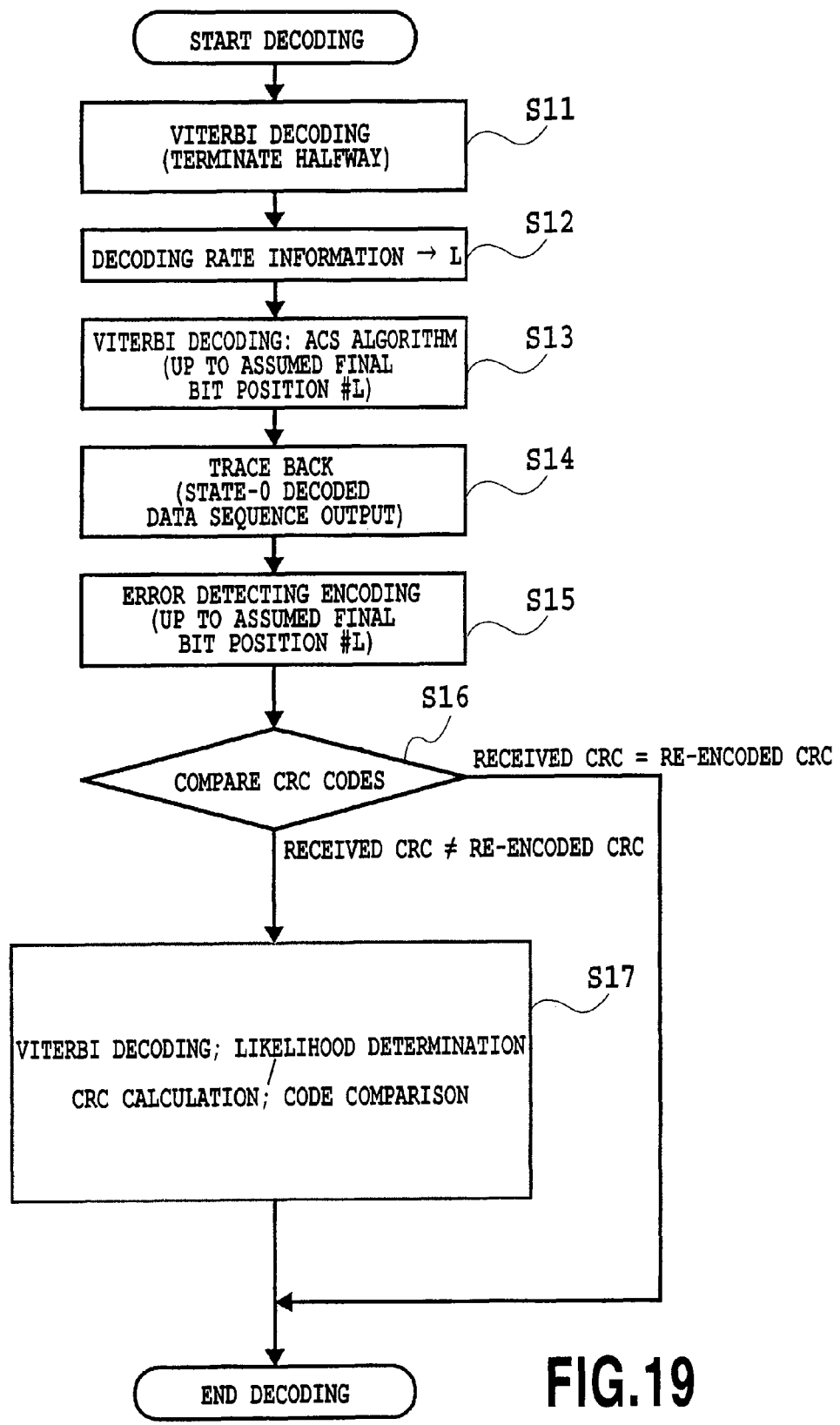
FIG. 19 is a flowchart illustrating an example of the rate decision processing in the second embodiment in accordance with the present invention.

FIG. 19 illustrates an example of the rate determination processing (algorithm) in the receiver of the present embodiment. The error correcting decoding circuit 26' assumes the position indicated by the content of the rate information memory 42 as the final bit, continues the Viterbi decoding of the frame data up to that position, terminates the decoding process, outputs the resultant decoded data sequence by tracing back, and generates the error detecting code (CRC code) (S11-S15).

When the re-encoded CRC agrees with the received CRC as a result of comparison, the decoding is completed (S16). Then, the position indicated by the rate information memory is decided as the final bit position of the transmitted frame data, and the transmission data is acquired (restored).

If the comparing result of the CRCs does not agree, the present embodiment performs the error correcting decoding and calculates the error detecting code by successively assuming the final bit position of the transmittable frame data other than the final bit position indicated by the content of the rate information memory, and makes the rate determination using the likelihood information at the Viterbi decoding and the comparing result of the error detecting codes (S17: the same processing as that of S1-S8 of FIG. 15).

In addition, as in the first embodiment, it is also possible, in between step S13 and S14, to determine the maximum likelihood (S3), obtain the likelihood difference (S4), and determine as to whether the likelihood difference is within a predetermined range or not (S5). If the likelihood difference is within the predetermined range, the processing can proceed to step S14, and if the likelihood difference is not within the predetermined range, the processing can proceed to step S17. When carrying out such processing (S3-S5), although the number of steps increases as compared with the case where such processing is not performed, the erroneous rate determination rate can be improved further. Here, as for Δ used at step S5 in between steps S13 and S14 and Δ used at step S5 in step S17, they can be the same or different.

When carrying out the data transmission using the transmitter and receiver with the foregoing configuration, the receiving side can reduce the erroneous detection probability of the rate during the variable rate data transmission, and at the same time the transmitting side can eliminate the need for providing the buffer for temporarily storing the transmission data.

Furthermore, when there is no transmission error, the receiver can detect the rate information without fail. In addition, even if the rate information makes an error during the transmission, the receiver can make a rate determination using the likelihood information at the Viterbi decoding and the comparing result of the error detecting codes. Thus, the present embodiment can improve the final frame error rate, and achieve a low erroneous rate determination rate. This enables highly reliable variable rate data transmission.

In the foregoing description, the reliability of the Viterbi decoding result of the rate information bit portion increases with an increase of the input signal stored in the decoder, that is, with the length of the succeeding encoding data sequence. Accordingly, it is preferable that the fixed length data sequence such as the error detecting code other than the transmission data be placed immediately after the rate information bit as much as possible.

On the other hand, it is also possible for the transmitter to insert the terminal bit after the rate information bit, and for the receiver to stop the decoding operation once at that position, and then resume the decoding operation after obtaining the received rate information to decode the frame data up to the final bit.

In the first and second embodiments, in making a determination (at the receiving side) as to whether the likelihood difference is within the prescribed range or not (step S5 of FIG. 15), it is also possible to change the prescribed ranges (the value of $\Delta$ in the example of FIG. 15) (so that they are different) in accordance with the final bit position of the assumed frame data.

When the present invention is applied to a real radio communication environment, the value of $\Delta$ suitable for obtaining desired detecting performance can vary for each final bit position (the number of bits of the different transmission data within the frame) depending on a tendency of the transmission bit error in the transmission channel. In such case, if a single value is shared as $\Delta$, the rate detecting performance will vary depending on the final bit position. This presents a problem in that when the ratio of the transmission frequency for each transmission rate (final bit position) varies, the average variable rate data transmission quality including the rate detecting performance will vary.

In view of this, it is conceivable to perform the determination setting the $\Delta$ for the threshold decision not at a single value but at different values ($\Delta 1, \Delta 2, \ldots, \Delta L, \ldots, \Delta N$) for each final bit position (individual transmission rate). Here, the value of each $\Delta L$ can be changed in response to the changes of the communication environment during the communication so that it always takes the optimum value. In addition, the same value can be repeatedly used partially as needed.

The first and second embodiments calculate the CRC code again based on the assumed transmission data, and decide, when it agrees with the assumed CRC code, that the assumed final bit position is the correct final bit position.

However, as described above, instead of calculating the CRC code again, it is also possible to divide the bit string consisting of the assumed transmission data and assumed CRC code by the generator polynomial used for calculating the CRC code at the transmitting side, and to make a determination that no error has occurred if it is divisible, and hence the assumed final bit position is the correct final bit position. If it is not divisible, it is possible to make a determination that an error has occurred, and hence the assumed final bit position is not the correct final bit position.

Third Embodiment

Figure 20:
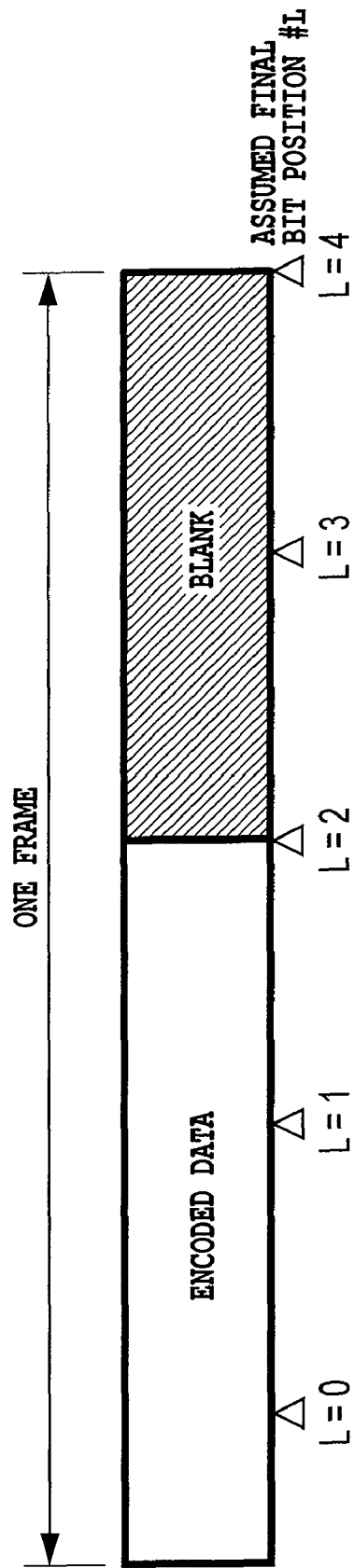
FIG. 20 is a diagram illustrating a frame and its positions.

Considering the case where the number of bits of the transmission data is zero in the first and second embodiments, if the number of bits of the transmission data is zero, the transmitting side can generate the frame data, setting a predetermined bit pattern as the error detecting code. The receiving side assumes the position at which the number of bits of the transmission data becomes zero as the final bit position of the frame data as well (in FIG. 20, the position L=0 is also assumed as the final bit position of the frame data), and if the error detecting code at the time when the above assumption is made agrees with the foregoing predetermined bit pattern, the position at which the number of bits of the transmission data becomes zero can be determined as the final bit position of the frame data.

In the real data transmission, the number of bits of the transmission data can become zero such as during a non-voice period (intervals during which a sender does not talk) in the case of transmitting audio information. It is preferable for the receiving side to detect the rate correctly including such cases (that is, when the apparent transmission rate=0) (this is because a decoding circuit of audio codec at the receiving side recognizes the non-voice periods, and sometimes carries out processing such as generating background noise, which differs from the processing performed during voice periods).

As the predetermined bit pattern, a bit pattern corresponding to the parity bit of the error detecting code can be used, for example (since there is no data, a bit pattern corresponding to the initial state of the error detecting encoding circuit, which is for example all zero can be used). When the number of bits of the transmission data is zero, the transmitting side transmits the bits corresponding to the parity bits of the error detecting code (since there is no data, only the bits corresponding to the parity bits are subjected to the error correcting encoding and transmitted). The receiving side carries out the rate detection including the final bit position in the case where the number of bits of the data is zero (the error detection in this case need not calculate (re-encode) the error detecting code for the received data, but only has to compare the bits corresponding to the received parity bits with the predetermined bit pattern). In addition, if the bits corresponding to the parity bits of the error detecting code are used as the predetermined bit pattern, it is not necessary to add a circuit for generating the predetermined bit pattern.

As for the length of the bit pattern, if it is made equal to the length of the parity bits of the error detecting code (or CRC) that is provided when the number of bits of the data is non-zero, the circuit can be used in common. However, it can take a different length as needed.

As for the bit pattern, at least one type of the pattern must be determined in advance. However, a plurality of types of the patterns can be determined so that they can be used in combination with other purposes (various types of control information are assigned to (mapped on) each bit pattern to be transmitted).

Fourth Embodiment

In the first to third embodiments, even such a channel as a control signal transmission channel which is inappropriate to be used as a control standard of the outer loop transmission power control (a partial mechanism in the double closed loop transmission power control constructed in combination with the inner loop transmission power control for carrying out block or frame error rate quality maintaining control), that is, even a channel that need not calculate the frame (block) error rate, always provides the error detecting code (CRC bits, for example) including the case where no data is present so that the performance at the blind rate detection is satisfactory, or transmits the rate information itself.

However, where CRC bits are provided even in intervals where no data occurs, if information is transmitted intermittently as in the control signal transmission channel, deterioration of the transmission efficiency due to overhead cannot be negligible.

In view of this, the fourth embodiment implements high quality variable rate data transmission based on accurate rate detection while reducing the overhead according to the idea of the blind rate detection that does not transmit the rate information.

A block configuration of the transmitter and receiver in the present embodiment is basically the same as that of the first embodiment shown in FIG. 10A and FIG. 10B. Accordingly, the following description will be made with regard to portions different from the first embodiment.

In the present embodiment, the sum of the transmission data length and the error detecting code (CRC bit) length within a frame is made 4096 bits at the maximum. In addition, the error detecting code length is made 16 bits. Accordingly, the transmission data length is one of the zero (no transmission data is present) and 1-4080 bits. The present embodiment reduces the overhead by preventing the transmission of the error detecting code when no transmission data is present, and increases the error detecting code length by the amount of reduction, thereby enabling more highly accurate rate detection (that is, higher quality variable rate transmission). As for the maximum value of the transmission data length or the error detecting code length, however, they can be altered. For example, the maximum value of the transmission data length can be set at 8 bits, 244 bits, and 1048576 bits, and the error detecting code length corresponding to them can be set at 8 bits, 12 bits, and 24 bits, respectively.

When there is no transmission data in a frame, the multiplexing circuit 6 outputs none of the transmission data, error detecting code and terminal bit.

Figure 21A:
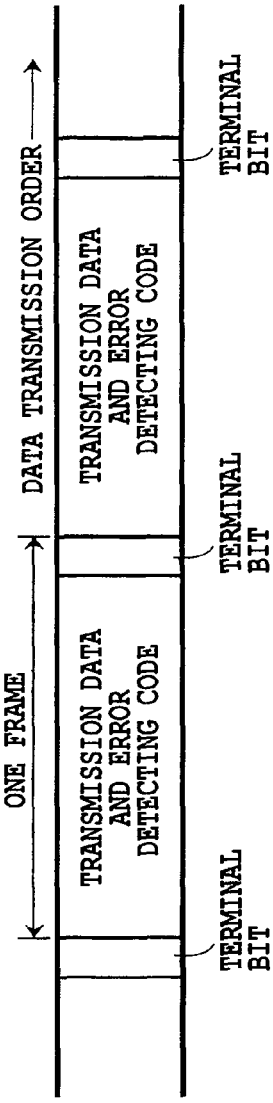
FIG. 21A is a diagram illustrating an example of a frame structure of the transmission data in a fourth embodiment in accordance with the present invention.
Figure 21B:
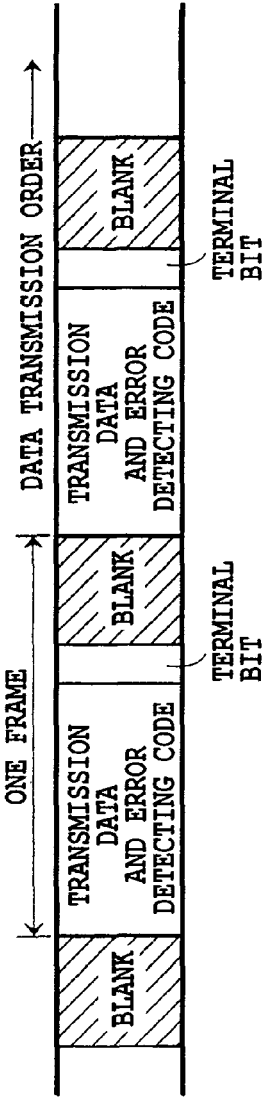
FIG. 21B is a diagram illustrating an example of the frame structure of the transmission data in the fourth embodiment in accordance with the present invention.
Figure 21C:
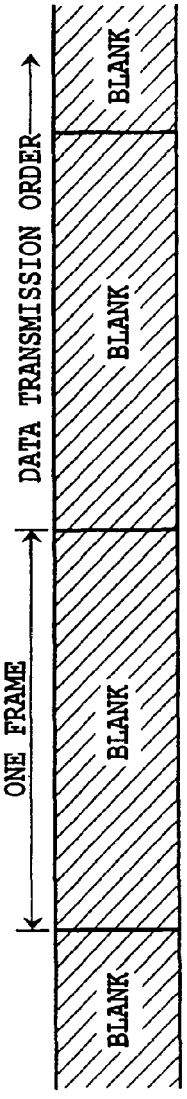
FIG. 21C is a diagram illustrating an example of the frame structure of the transmission data in the fourth embodiment in accordance with the present invention.

FIG. 21A, FIG. 21B and FIG. 21C illustrate examples of the data sequence output from the multiplexing circuit 6. FIG. 21A illustrates a case where the transmission rate of the transmission data is maximum; and FIG. 21B and FIG. 21C illustrate a case where the transmission rate is less than the maximum rate. At the transmission less than the maximum rate, a frame includes vacant time (time without data). In addition, FIG. 21A and FIG. 21B illustrate a case where transmission data is present, and FIG. 21C illustrates a case where no transmission data is present. The transmission data length in each frame varies with time, and the data sequence output from the multiplexing circuit 6 is as illustrated in FIG. 21A at one time, as in FIG. 21B at another time and as in FIG. 21C at still another time.

The data sequence output from the multiplexing circuit 6 is subjected to convolution encoding in the error correcting encoding circuit 8, and is delivered to the interleaving circuit 10 to undergo interleaving. However, when no transmission data is present in the frame, the convolution encoding is not carried out.

If the re-encoded CRC does not agree with the received CRC at any of the assumed final bit positions, the present embodiment makes a determination that no transmission data is present or that the received frame data has an error.

According to the present embodiment, since it does not transmit the error detecting code as to the frame that does not have the transmission data, the overhead can be reduce.

Fifth Embodiment

The fifth embodiment, employing the idea of the fourth embodiment, transmits the transmission rate information in the same manner as in the second embodiment.

A block configuration of the transmitter and receiver in the present embodiment is basically the same as that of the second embodiment shown in FIG. 17A and FIG. 17B. Accordingly, the following description will be made with regard to portions different from the second embodiment.

The information representing the rate of the transmission data (transmission rate information) applied to the terminal 5 is delivered to the rate information memory 40. Here, the content of the rate information memory 40 becomes the rate information of the transmission data, that is, the information representing the number of bits. The multiplexing circuit 6' sequentially outputs the information representing the rate of the transmission data read out from the rate information memory 40, the transmission data transferred from the terminal 1, the error detecting code calculated for the transmission data by the error detecting encoding circuit 4, and the terminal bit on a frame by frame basis. However, if no transmission data is present in the frame, the multiplexing circuit 6' outputs none of the transmission data, error detecting code and terminal bit, but outputs only the transmission rate information.

In the present embodiment also, the sum of the transmission data length and the error detecting code (CRC bit) length within a frame is made 4096 bits at the maximum. In addition, the error detecting code length is made 16 bits. However, the maximum value of the transmission data length and the error detecting code length can take other values.

FIG. 22A, FIG. 22B and FIG. 22C illustrate examples of the data sequence output from the multiplexing circuit 6'. FIG. 22A illustrates a case where the transmission rate of the transmission data is maximum; FIG. 22B illustrates a case where the transmission rate is less than the maximum rate and the transmission data is present; and FIG. 22C illustrates a case where the transmission data is not present.

If the re-encoded CRC does not agree with the received CRC at any of the assumed final bit positions, the present embodiment makes a determination that no transmission data is present, or that the received frame data has an error.

According to the present embodiment, since it prevents the transmission of the error detecting code as to the frame that does not have the transmission data, the overhead can be reduced.

Sixth Embodiment

The data transmission method shown in the fourth or fifth embodiment is applicable to part of a plurality of channels (the variable length data thereof) whose transmission data are multiplexed (put) into each frame. For example, when the channels to be multiplexed include a control signal transmission channel, it is conceivable that the method of the fourth or fifth embodiment is applied only to the control signal transmission channel.

Figure 23:
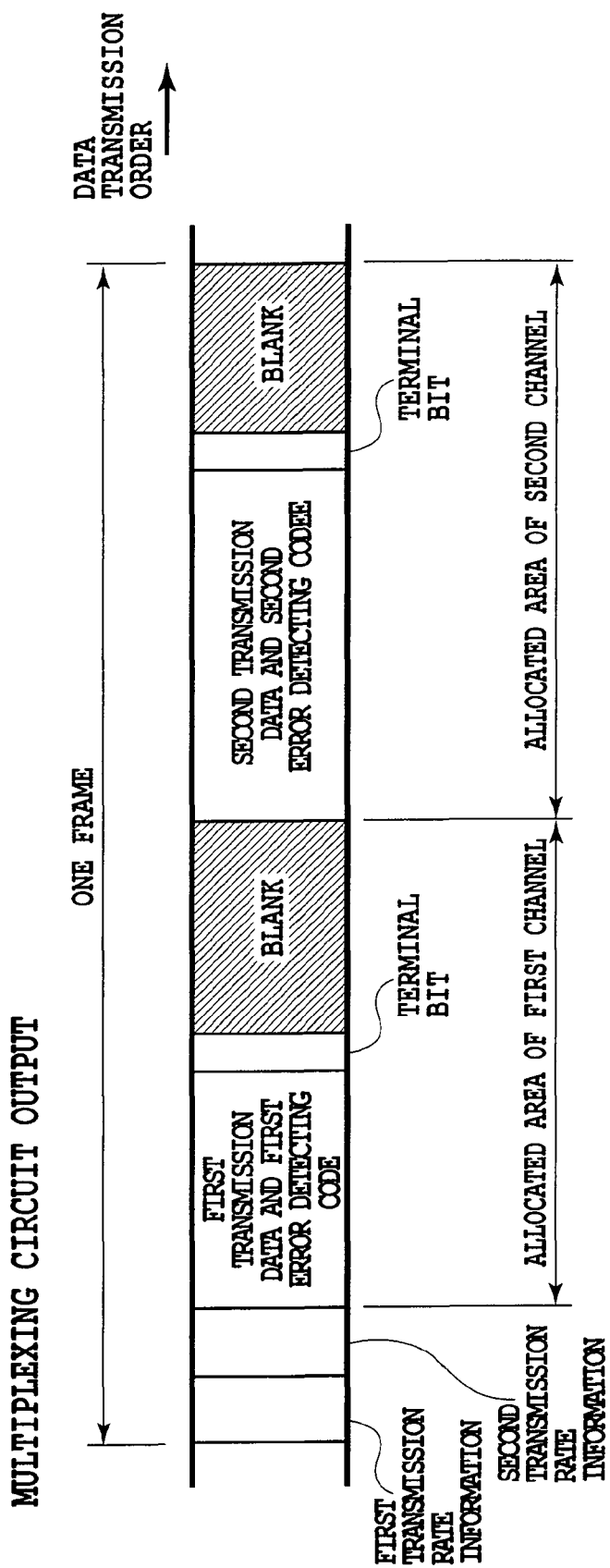
FIG. 23 is a diagram illustrating an example which places transmission data of two channels in a single frame.

FIG. 23 is a diagram illustrating an example of including the transmission data of two channels into one frame. In FIG. 23, the data transmission method shown in the fifth embodiment is applied to one of the two channels (a first channel, here). The data transmission method described in the second embodiment is applied to the other channel (that is, a second channel). However, it is also possible to apply to the second channel the data transmission method that determines the transmission rate using only the transmission rate information without using (adding) the error detecting code. In addition, when the transmission data of the second channel has a fixed length, a data transmission method that does not make a transmission rate determination is applicable to the second channel.

In the example of FIG. 23, the transmission rate information of the first channel (first transmission rate information) and the transmission rate information of the second channel (second transmission rate information) are placed into one frame, first. Then, there are provided an allocated area of the first channel (fixed length) and an allocated area of the second channel (fixed length). In each allocated area, the transmission data, error detecting code and terminal bit of each channel are placed. As for the first channel, however, if no transmission data is present in the frame, none of the transmission data, error detecting code and terminal bit is put into the allocated area of the first channel. It is also possible for the first transmission rate information and second transmission rate information to be put into the allocated areas of the respective channels.

The transmission rate information items in each channel can be combined to a single piece of transmission rate information.

Figure 24:
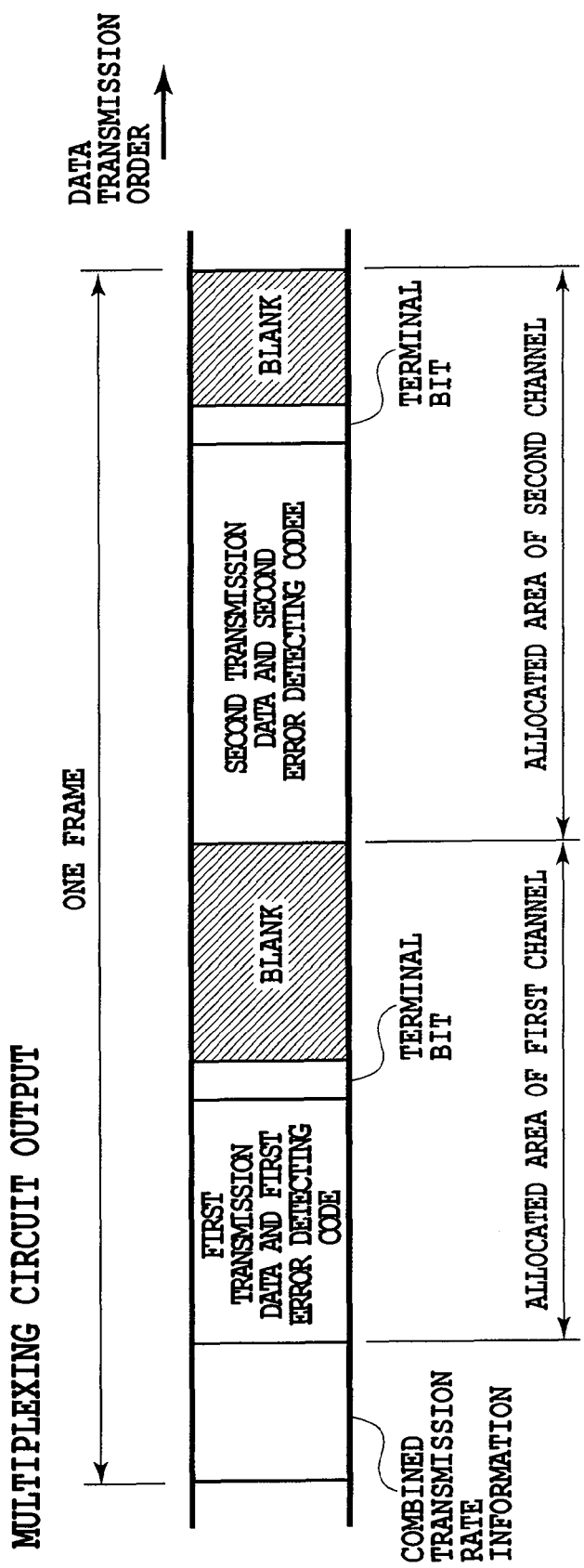
FIG. 24 is a diagram illustrating an example which combines information items with two transmission rates into information with a single transmission rate in FIG. 23.

FIG. 24 is a diagram illustrating a case where the two transmission rate information items in FIG. 23 are combined into a single piece of transmission rate information. For example, it is assumed that the first channel can take five transmission rates of 0 kbps, 10 kbps, 20 kbps, 30 kbps and 40 kbps and the second channel can take three transmission rates of 0 kbps, 50 kbps and 100 kbps. In this case, when the separate transmission rate information items are employed as illustrated in FIG. 23, the first transmission rate information requires 3 bits and the second transmission rate information requires 2 bits, thus requiring 5 bits in total. On the other hand, when the combined transmission rate information is employed as illustrated in FIG. 24, the first channel transmission rate/second channel transmission rate can be represented by 15 (=5×3) expressions, including: 0 kbps/0 kbps, 10 kbps/0 kbps, 20 kbps/0 kbps, . . . , 20 kbps/100 kbps, 30 kbps/100 kbps and 40 kbps/100 kbps. Accordingly, four bits are enough for the combined transmission rate information. Thus, employing the combined transmission rate information offers an advantage of being able to reduce the overhead.

As to the transmission rate information, it is possible to transmit only that of the first channel, or only that of the second channel, or not to transmit either of them (the two channels). For example, it is conceivable that the transmission rate information of the first channel is not transmitted, and that the method of the fourth embodiment (the method of transmitting data, excluding the transmission rate information) is applied to the first channel instead of the method of the fifth embodiment (the method of transmitting data, including the transmission rate information). When the transmission rate information of the second channel is not transmitted, the data transmission method described in the first embodiment is applied to the second channel.

In some cases, it is considered to be better to transmit the transmission rate information for all the channels or not to transmit it for any of the channels depending on the conditions of the circuit and the like of the transmitting-receiving apparatus. The reason for this is as follows. Specifically, although the error correcting code (block encoding, for example) is also applied to the transmission rate information, there are some cases where the error correcting encoding (convolution encoding, for example) of the portion including the error detecting code is an encoding with relatively higher error correction performance (that is, the transmission quality of the transmission rate information is relatively lower). In such a case, even if the transmission rate information is present, detecting the transmission rate according to the error detecting code, without relying on the transmission rate information, can sometimes improve the detecting accuracy. Here, when adopting the combined transmission rate information, it is considered to be possible for the channel employing the method of the fifth embodiment not to include its transmission rate information into the combined transmission rate information. In the foregoing example, if the combined transmission rate information does not include the transmission rate information of the first channel, the combined transmission rate information can include only the transmission rate information of the second channel, and hence two bits are enough. However, making fine adjustments of the transmission format (using a variable format) in order to transmit only the necessary number of bits of the transmission rate information generally complicates the circuit, and this is not always appropriate.

The foregoing example is described by way of example in which one channel employs the method of the fourth or fifth embodiment, while the other another channel does not employ it. However, it is also possible to have two or more channels that employ it or two or more channels that do not employ it.

As for the error correcting encoding, it is conceivable that the transmission rate information portion is subjected to block encoding, and the allocated area of each channel undergoes convolution encoding. However, it is also possible to carry out convolution encoding of the transmission rate information portion, for example. In this case, the transmission rate information portion and the allocated area of the first channel can undergo the convolution encoding separately or together.

Seventh Embodiment

In the sixth embodiment, it is conceivable to carry out double closed loop transmission power control that is comprised of inner loop transmission power control and outer loop transmission power control. In this case, as the control standard of the outer loop transmission power control (simply called "control standard" from now on), it will be possible to use one or more channels of the remaining channels rather than the channel to which the method of the fourth or fifth embodiment is applied.

For example, when the control signal transmission channel is included in the channels to be multiplexed, it is conceivable that instead of the control signal transmission channel, one or more of the remaining channels are used as the control standard. The control signal transmission channel generally transmits the information intermittently. Accordingly, it cannot carry out the outer loop transmission power control (block or frame error rate quality maintaining control) accurately which uses the result of the received CRC determination as the control standard, for example.

The outer loop transmission power control is presumed to carry out the inner loop transmission power control simultaneously. As concrete outer loop transmission power control, there is one that adjusts the target SIR (signal to interference and noise ratio) used in the inner loop transmission power control in such a manner that the frame (block) error rate quality measured separately by the receiving side reaches a target value. Here, the inner loop transmission power control refers to the control that has the receiving side compare the received SIR of the received signal with the preset (target) SIR, such that when the received SIR is less than the target SIR (that is, when the receiving quality is less than the target quality), the receiving side transmits the control signal to the transmitting side to increase the transmission power; and conversely when the received SIR at the receiving side is greater than the target SIR (that is, when the receiving quality is higher than the target quality), the receiving side transmits the control signal to the transmitting side to decrease the transmission power.

Generally, the outer loop transmission power control is the control (double closed loop control) that carries out its control more smoothly than the inner loop transmission power control. In addition, when a plurality of channels undergo multiplexed transmission, and the target frame (block) error rate quality is set for each channel, the target SIR the inner loop transmission power control uses is adjusted in such a manner as to satisfy all the target frame (block) error rate qualities.

As for the relative ratio of the encoding rates between the channels to be multiplexed at the time of error correcting encoding and the relative ratio of the transmission powers between the channels to be multiplexed, they can be made constant. The relative ratios can be determined considering the quality required by each channel.

When the relative ratio of the transmission powers is constant, once the transmission power of the channel used as the control standard is decided by the outer loop transmission power control, the transmission power of the channel that is not used as the control standard is also determined. Thus, the transmission power of the channel that is not used as the control standard can be controlled indirectly.

Furthermore, it is also conceivable that there is a case of varying the transmission power in response to the rate. In this case, for example, the relative ratio Q between the transmission power at the maximum rate $R_{1,M}$ of the channel assigned as the control standard and the transmission power at the maximum rate $R_{2,M}$ of the channel unassigned as the control standard is determined at a certain fixed value. In addition, it is assume that the relative ratio between the transmission power at a particular rate $R_{1,J}$ of the channel assigned as the control standard and the transmission power at the maximum rate $R_{1,M}$ is given by $S(R_{1,J})$, and that the relative ratio between the transmission power at a particular rate $R_{2,K}$ of the channel unassigned as the control standard and the transmission power of the maximum rate $R_{2,M}$ is given by $S(R_{2,K})$. Then, when the transmission power at the particular rate $R_{1,J}$ of the channel assigned as the control standard is determined at $P_{1,J}$, the transmission power $P_{2,K}$ at the rate $R_{2,K}$ of the channel unassigned as the control standard is determined as $P_{1,J} \times Q \times S(R_{2,K})/S(R_{1,J})$.

MISCELLANEOUS

In Mobile Communications, a Mobile Station can Include One or both of the transmitter and receiver described in the foregoing first through seventh embodiments.

Besides, a base station can also include one or both of the transmitter and receiver described in the foregoing first through seventh embodiments.

The invention claimed is:

1. A data transmission method of making transmission by including variable length transmission data into each frame that has a fixed time length, said data transmission method comprising:

at a transmitting side,
a step of calculating an error detecting code of the transmission data in each frame;
a step of placing the calculated error detecting code after the transmission data in each frame, and generating frame data by rearranging an R-bit series before a final bit position of the error detecting code in inverse order in each frame; and
a step of transmitting the generated frame data, and at a receiving side,
a step of receiving the frame data;
a step of assuming the transmission data and the error detecting code for the received frame data by assuming a final bit position of the frame data in each frame;
a step of making a determination in each frame that, among the assumed final bit positions of the frame data, a position that is determined to be errorless as a result of error detection carried out on a basis of the assumed transmission data and error detecting code is the final bit position of the frame data; and
a step of obtaining the transmission data on a basis of the determination result in each frame, wherein the step of assuming the transmission data and error detecting code assumes the transmission data and error detecting code in each frame on a presumption that the error detecting code is placed after the transmission data, and the R-bit series before the final bit position of the error detecting code is rearranged in inverse order; and said R is a natural number equal to or greater than 2, and is greater or smaller than the number of bits of the error detecting code.

2. The data transmission method as claimed in claim 1, wherein said R is greater than the number of bits of the error detecting code.

3. A data transmission system for making transmission by including variable length transmission data into each frame that has a fixed time length, said data transmission system comprising:

in a transmitting side apparatus,
means for calculating an error detecting code of the transmission data in each frame;
means for placing the calculated error detecting code after the transmission data in each frame, and generating frame data by rearranging an R-bit series before a final bit position of the error detecting code in inverse order in each frame; and
means for transmitting the generated frame data, and in a receiving side apparatus,
means for receiving the frame data;
means for assuming the transmission data and the error detecting code for the frame data received by assuming a final bit position of the frame data in each frame;
means for making a determination in each frame that among the assumed final bit positions of the frame data, a position that is determined to be errorless as a result of error detection carried out on a basis of the assumed transmission data and error detecting code is the final bit position of the frame data; and
means for obtaining the transmission data on a basis of the decision result in each frame, wherein said means for assuming the transmission data and error detecting code assumes the transmission data and error detecting code in each frame on a presumption that the error detecting code is placed after the transmission data, and the R-bit series before the final bit position of the error detecting code is rearranged in inverse order; and said R is a natural number equal to or greater than 2, and is greater or smaller than the number of bits of the error detecting code.

4. The data transmission system as claimed in claim 3, wherein said R is greater than the number of bits of the error detecting code.

5. A data transmitting method of making transmission by including variable length transmission data into each frame that has a fixed time length, said data transmitting method comprising:
- a step of calculating an error detecting code of the transmission data in each frame;
- a step of placing the calculated error detecting code after the transmission data in each frame, and generating frame data by rearranging an R-bit series before a final bit position of the error detecting code in inverse order in each frame; and
- a step of transmitting the generated frame data, wherein said R is a natural number equal to or greater than 2, and is greater or smaller than the number of bits of the error detecting code.

6. A receiving method of receiving frame data in which an error detecting code calculated about variable length transmission data is placed after the transmission data in each frame that has a fixed time length, and in which an R-bit series before a final bit position of the error detecting code is rearranged in inverse order in each frame, said receiving method comprising:
- a step of receiving the frame data;
- a step of assuming the transmission data and the error detecting code for the received frame data by assuming a final bit position of the frame data in each frame;
- a step of making a determination in each frame that among the assumed final bit positions of the frame data, a position that is determined to be errorless as a result of error detection carried out on a basis of the assumed transmission data and error detecting code is the final bit position of the frame data; and
- a step of obtaining the transmission data on a basis of the decision result in each frame, wherein
- the step of assuming the transmission data and error detecting code assumes the transmission data and error detecting code in each frame on the presumption that the error detecting code is placed after the transmission data, and the R-bit series before the final bit position of the error detecting code is rearranged in inverse order; and said R is a natural number equal to or greater than 2, and is greater or smaller than the number of bits of the error detecting code.

7. A transmitting apparatus for making transmission by including variable length transmission data into each frame that has a fixed time length, said data transmitting apparatus comprising:
- means for calculating an error detecting code of the transmission data in each frame;
- means for placing the calculated error detecting code after the transmission data in each frame, and generating frame data by rearranging an R-bit series before a final bit position of the error detecting code in inverse order in each frame; and
- means for transmitting the generated frame data, wherein said R is a natural number equal to or greater than 2, and is greater or smaller than the number of bits of the error detecting code.

8. A receiving apparatus for receiving frame data in which an error detecting code calculated about variable length transmission data is placed after the transmission data in each frame that has a fixed time length, and in which an R-bit series before a final bit position of the error detecting code is rearranged in inverse order in each frame, said receiving apparatus comprising:
- means for receiving the frame data;
- means for assuming the transmission data and the error detecting code for the frame data received by assuming a final bit position of the frame data in each frame;
- means for making a determination in each frame that among the assumed final bit positions of the frame data, a position that is determined to be errorless as a result of error detection carried out on a basis of the assumed transmission data and error detecting code is the final bit position of the frame data; and
- means for obtaining the transmission data on a basis of the decision result in each frame, wherein
- said means for assuming the transmission data and error detecting code assumes the transmission data and error detecting code in each frame on the presumption that the error detecting code is placed after the transmission data, and the R-bit series before the final bit position of the error detecting code is rearranged in inverse order; and
- said R is a natural number equal to or greater than 2, and is greater or smaller than the number of bits of the error detecting code.

* * * * *